US011239238B2

(12) United States Patent
Gomes et al.

(10) Patent No.: US 11,239,238 B2
(45) Date of Patent: Feb. 1, 2022

(54) THIN FILM TRANSISTOR BASED MEMORY CELLS ON BOTH SIDES OF A LAYER OF LOGIC DEVICES

(71) Applicant: Intel Corporation, Santa Clara, CA (US)

(72) Inventors: Wilfred Gomes, Portland, OR (US); Mauro J. Kobrinsky, Portland, OR (US); Conor P. Puls, Portland, OR (US); Kevin Fischer, Hillsboro, OR (US); Bernhard Sell, Portland, OR (US); Abhishek A. Sharma, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 16/667,740

(22) Filed: Oct. 29, 2019

(65) Prior Publication Data

US 2021/0125990 A1  Apr. 29, 2021

(51) Int. Cl.
*H01L 27/108* (2006.01)
*H01L 23/522* (2006.01)
(Continued)

(52) U.S. Cl.
CPC .... *H01L 27/10805* (2013.01); *H01L 23/5226* (2013.01); *H01L 23/5286* (2013.01);
(Continued)

(58) Field of Classification Search
CPC ......... H01L 27/10805; H01L 27/10897; H01L 23/5226; H01L 23/5286; H01L 24/32
See application file for complete search history.

(56) References Cited

U.S. PATENT DOCUMENTS 7,092,288 B2    8/2006  Lojek
7,701,751 B2    4/2010  Kang et al.
(Continued)

FOREIGN PATENT DOCUMENTS

EP        3534401 A2     9/2019
WO     2018208719 A1    11/2018

OTHER PUBLICATIONS

Anil, D.G., et al., "Performance Evaluation of Ternary Computation in SRAM Design Using Graphene Nanoribbon Field Effect Transistors," IEEE 8th Annual Computing and Communication Workshop and Conference (CCWC), Las Vegas, NV, pp. 382-388 (2018).
(Continued)

*Primary Examiner* — Joseph C. Nicely
(74) *Attorney, Agent, or Firm* — Patent Capital Group

(57) ABSTRACT

Described herein are IC devices that include TFT based memory arrays on both sides of a layer of logic devices. An example IC device includes a support structure (e.g., a substrate) on which one or more logic devices may be implemented. The IC device further includes a first memory cell on one side of the support structure, and a second memory cell on the other side of the support structure, where each of the first memory cell and the second memory cell includes a TFT as an access transistor. Providing TFT based memory cells on both sides of a layer of logic devices allows significantly increasing density of memory cells in a memory array having a given footprint area, or, conversely, significantly reducing the footprint area of the memory array with a given memory cell density.

23 Claims, 16 Drawing Sheets

(51) Int. Cl.
*H01L 23/528* (2006.01)
*H01L 23/00* (2006.01)
*H01L 29/24* (2006.01)
*H01L 49/02* (2006.01)
*H01L 29/786* (2006.01)
*H01L 29/66* (2006.01)
*H01L 27/11* (2006.01)

(52) U.S. Cl.
CPC ............ *H01L 24/32* (2013.01); *H01L 24/83* (2013.01); *H01L 27/10873* (2013.01); *H01L 27/10897* (2013.01); *H01L 28/60* (2013.01); *H01L 29/24* (2013.01); *H01L 29/66969* (2013.01); *H01L 29/7869* (2013.01); *H01L 29/78681* (2013.01); *H01L 27/1104* (2013.01); *H01L 2224/32225* (2013.01); *H01L 2924/1436* (2013.01); *H01L 2924/1437* (2013.01)

(56) References Cited

U.S. PATENT DOCUMENTS

| | | |
|---|---|---|
| 7,804,702 B2 | 9/2010 | Madan |
| 8,178,862 B2 | 5/2012 | Colinge |
| 2002/0036313 A1 | 3/2002 | Yang et al. |
| 2006/0084204 A1 | 4/2006 | Yin et al. |
| 2009/0303801 A1 | 12/2009 | Kim |
| 2010/0295102 A1 | 11/2010 | Sankin et al. |
| 2015/0035568 A1 | 2/2015 | Peng et al. |
| 2015/0162336 A1 | 6/2015 | Kim et al. |
| 2016/0197069 A1 | 7/2016 | Morrow et al. |
| 2017/0256480 A1* | 9/2017 | Reingruber ....... H01L 23/49822 |
| 2017/0287905 A1 | 10/2017 | Morrow et al. |
| 2018/0323199 A1 | 11/2018 | Roberts et al. |
| 2019/0103406 A1 | 4/2019 | Tang et al. |
| 2019/0287908 A1 | 9/2019 | Dogiamis et al. |
| 2019/0305135 A1 | 10/2019 | Radosavljevic et al. |
| 2019/0326296 A1* | 10/2019 | Wang ................... H01L 23/528 |
| 2020/0105719 A1* | 4/2020 | Li ....................... H01L 25/0652 |
| 2020/0111918 A1* | 4/2020 | Karda .................. G11C 11/404 |
| 2020/0127142 A1 | 4/2020 | Dewey et al. |
| 2020/0273751 A1 | 8/2020 | Dasgupta et al. |
| 2020/0411078 A1* | 12/2020 | Sharma ............... H01L 27/0688 |
| 2020/0411524 A1* | 12/2020 | Arslan ................ H01L 27/1218 |
| 2021/0098062 A1* | 4/2021 | Kwon .................... G11C 5/025 |

OTHER PUBLICATIONS

Barroso, Luiz A., "Impact of Chip-Level Integration on Performance of OLTP Workloads," Sixth International Symposium on High-Performance Computer Architecture (HPCA), Jan. 2000, 12 pages.

Extended European Search Report from European Application No. 20191821.6 dated Feb. 2, 2021, 9 pages.

Fujun B. et al., "A Stacked Embedded DRAM Array for LPDDR4/4X using Hybrid Bonding 3D Integration with 34GB/s/1Gb 0.88 pJ/b Logic-to-Memory Interface," 2020 IEEE International Electron Devices Meeting (IEDM) Dec. 12, 2020 (pp. 6-6); 4 pages.

Hsieh, E.R., et al., "A Novel Architecture to Build Ideal-linearity Neuromorphic Synapses on a Pure Logic FinFET Platform Featuring 2.5ns PGM-time and 1012 Endurance," 2019 Symposium on VLSI Technology Digest of Technical Papers; 2 pages.

Joshi, S., et al., "Graphene Nanoribbon Field Effect Transistor Based Ultra-Low Energy SRAM Design," IEEE International Symposium on Nanoelectronic and Information Systems (iNIS), Gwalior, pp. 76-79 (2016).

Khasanvis, S., et al., "Low-Power Heterogeneous Graphene Nanoribbon-CMOS Multistate Volatile Memory Circuit," 17 pages.

Non Final Office Action in U.S. Appl. No. 16/669,599 dated Jul. 13, 2021, 10 pages.

Non Final Office Action of U.S. Appl. No. 16/669,599 dated Jan. 11, 2021, 9 pages.

Non Final Office Action of U.S. Appl. No. 16/806,283 dated Jan. 7, 2021, 7 pages.

Notice of Allowance in U.S. Appl. No. 16/724,691 dated Jan. 13, 2021, 9 pages.

Partial European Search Report from European Application No. 20181563.6 dated Jan. 21, 2021, 13 pages.

Rabieefar, et al., "Utilizing Graphene Nano-Ribbon Transistor in Data Converters: A Comparative Study," ECS Journal of Solid State Science and Technology, 8; M30-M37 (2019).

Sinha, Saurabh, et al., "Stack up your chips: Betting on 3D integration to augment Moores Law scaling," IEEE Smart City Summit (SCS) Conference, Nov. 1, 2019, San Jose, CA; 5 pages.

Trombini, H., et al., "Unraveling structural and compositional information in 3D FinFET electronic devices," Nature.com/Scientific Reports; 7 pages (Aug. 12, 2019).

Xu, C., et al., "Modeling, Analysis, and Design of Graphene Nano-Ribbon Interconnects," IEEE Transaction on Electron Devices; vol. 56, No. 8; pp. 1567-1578 (Aug. 2009).

* cited by examiner

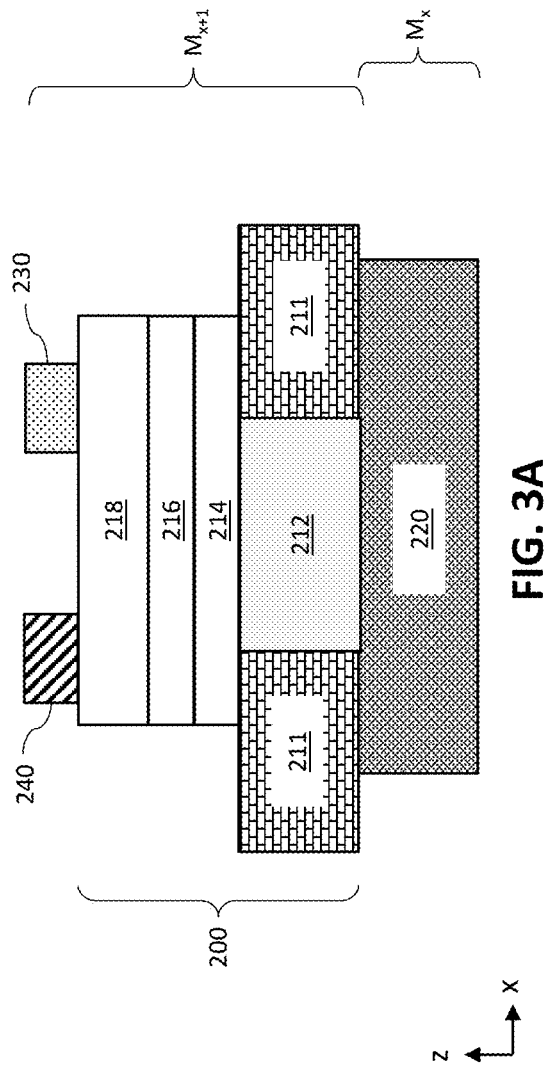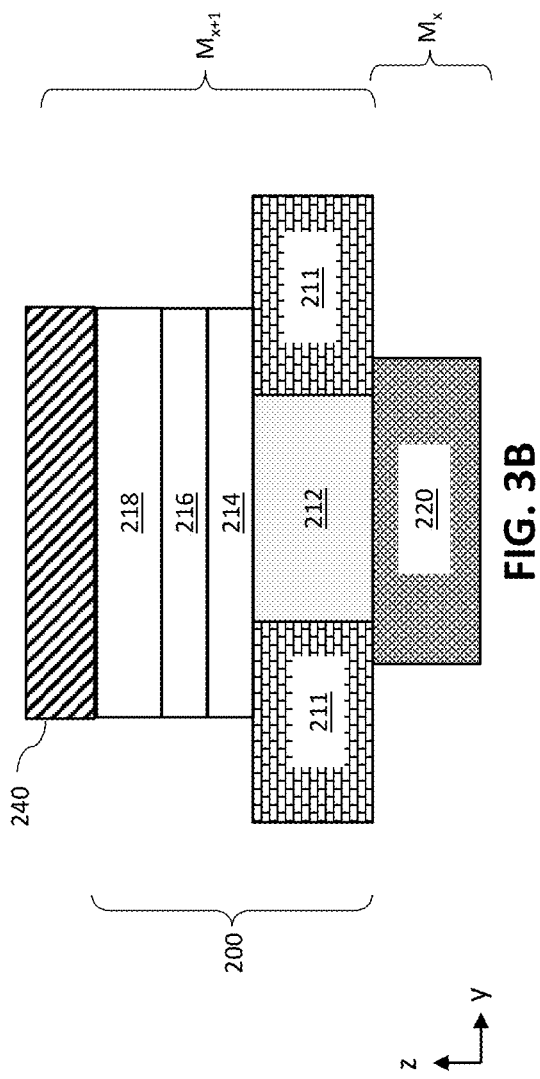

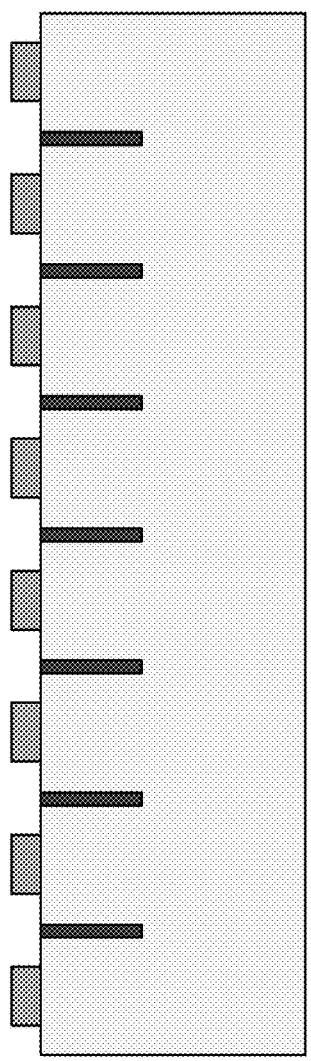
FIG. 5A
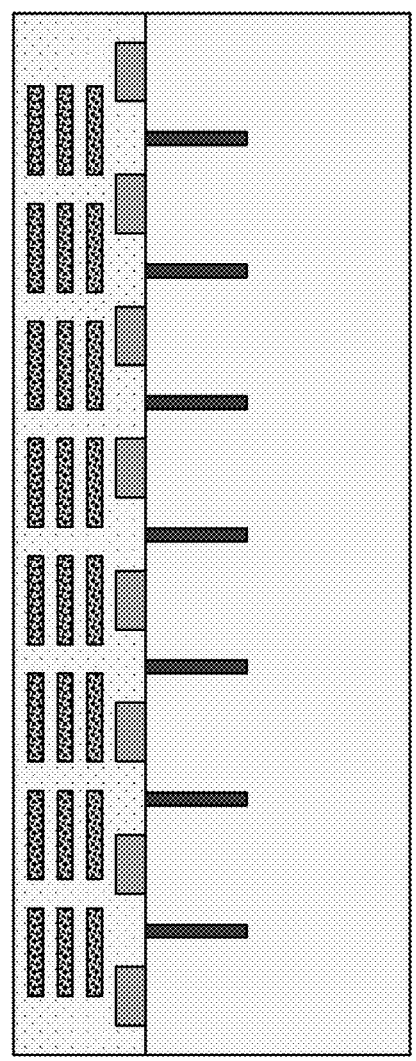
FIG. 5B

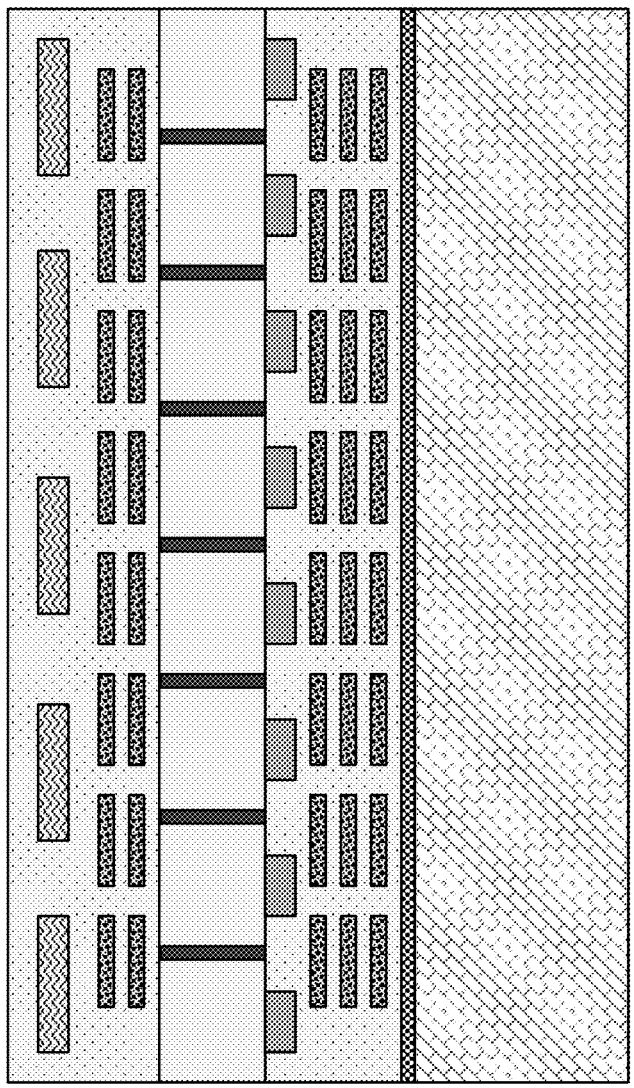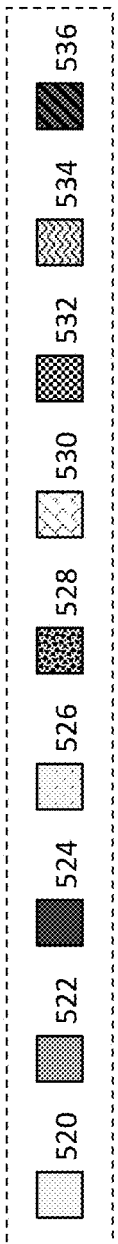
FIG. 5F

THIN FILM TRANSISTOR BASED MEMORY CELLS ON BOTH SIDES OF A LAYER OF LOGIC DEVICES

BACKGROUND

Embedded memory is important to the performance of modern system-on-a-chip (SoC) technology. Static random-access memory (SRAM) is one example of embedded memory, particularly suitable for modern SoC due to its compatibility with fabrication processes used to manufacture computing logic, e.g., front end of line (FEOL) processes. However, for some applications demanding large on-die cache, such as tens of megabytes (MBs) for handling memory bandwidth, the area and standby power of a SRAM-based cache may pose significant challenges to SoC design.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3B are cross-sectional views of an example structure of the access TFT in the memory cell of FIGS. 2A-2B, according to some embodiments of the present disclosure.

FIGS. 5A-5H are cross-sectional side views, illustrating various stages in the manufacture of an example IC device according to the method of FIG. 4, according to some embodiments of the present disclosure.

DETAILED DESCRIPTION

Overview

Figure 1:
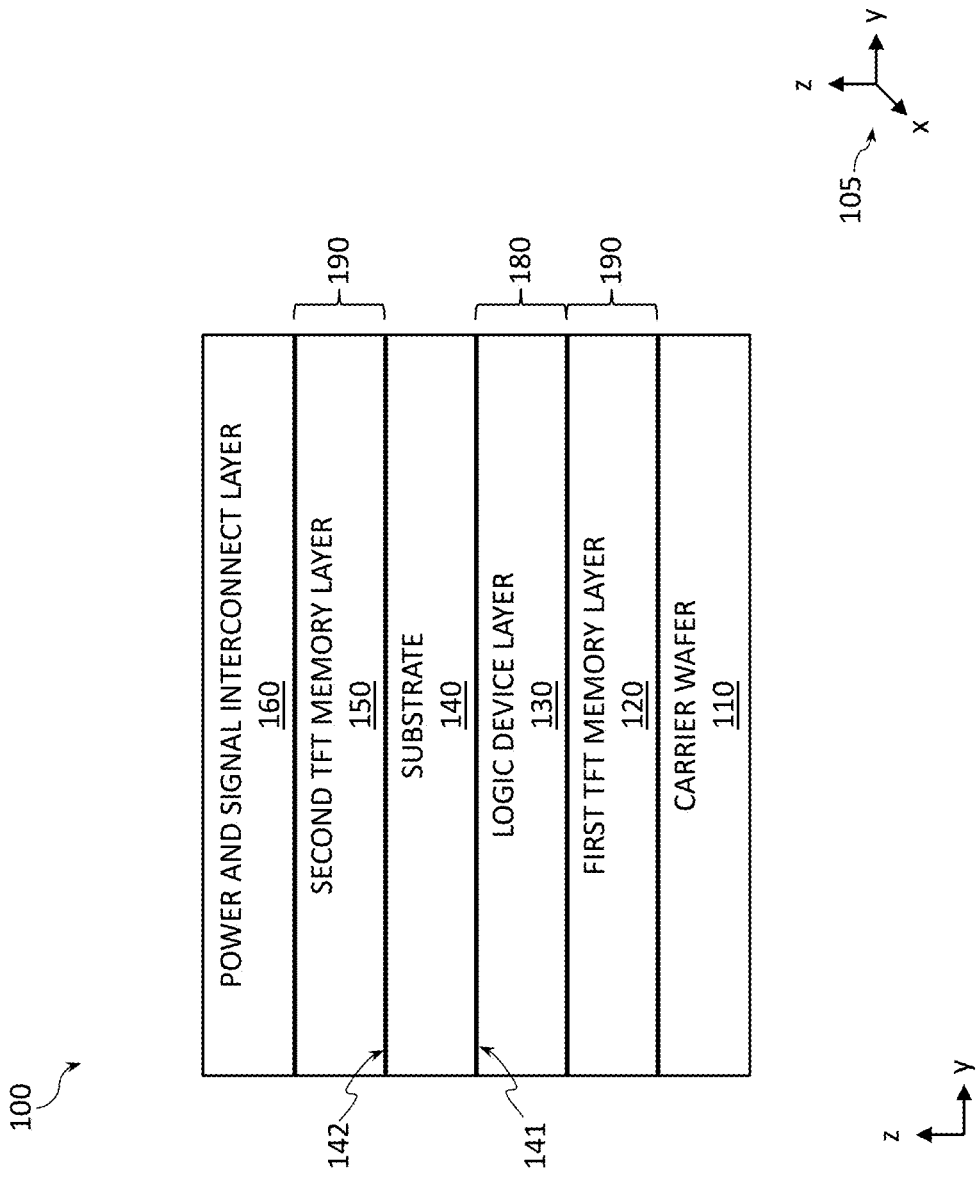
FIG. 1 provides a schematic illustration of a cross-sectional view of an example integrated circuit (IC) device with thin film transistor (TFT) based memory cells on both sides of a layer of logic devices, according to some embodiments of the present disclosure

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of large SRAM-based caches. However, embodiments of the present disclosure are equally applicable to memory cells implemented other technologies. Thus, in general, memory cells described herein may be implemented as eDRAM cells, spin-transfer torque random access memory (STTRAM) cells, resistive random-access memory (RRAM) cells, or any other non-volatile memory cells.

A memory cell, e.g., an eDRAM cell, may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The capacitor of a 1T-1C memory cell may be coupled to one source/drain (S/D) terminal of the access transistor (e.g., to the source terminal of the access transistor), while the other S/D terminal of the access transistor may be coupled to a bit-line (BL), and a gate terminal of the transistor may be coupled to a word-line (WL). Since such a memory cell can be fabricated with as little as a single access transistor, it can provide higher density and lower standby power versus SRAM in the same process technology.

Various 1T-1C memory cells have, conventionally, been implemented with access transistors being FEOL, logic-process based, transistors implemented in an upper-most layer of a semiconductor substrate. However, using standard logic transistors as access transistors of 1T-1C memory cells creates several challenges.

One challenge relates to the leakage of an access transistor, i.e., current flowing between the source and the drain of a transistor when the transistor is in an "off" state. Since reducing leakage of logic transistors in the scaled technology is difficult, implementing 1T-1C memory in advanced technology nodes (e.g., 10 nanometer (nm), 7 nm, 5 nm, and beyond) can be challenging. In particular, given a certain access transistor leakage, capacitance of the capacitor of a 1T-1C memory cell should be large enough so that sufficient charge can be stored on the capacitor to meet the corresponding refresh times. However, continuous desire to decrease size of electronic components dictates that the macro area of memory arrays continues to decrease, placing limitations on how large the top area (i.e., the footprint) of a given capacitor is allowed to be, which means that capacitors need to be taller in order to have both sufficiently small footprint area and sufficiently large capacitance. As the capacitor dimensions continue to scale, this in turn creates a challenge for etching the openings for forming the capacitors as tall capacitors with small footprint areas require higher aspect ratio openings, something which is not easy to achieve.

Another challenge associated with the use of logic transistors in 1T-1C memory cells relates to the location of the capacitors such memory cells. Namely, it may be desirable to provide capacitors in metal layers close to their corresponding access transistors. Since logic transistors are implemented as FEOL transistors provided directly on the semiconductor substrate, the corresponding capacitors of 1T-1C memory cells then have to be embedded in lower metal layers in order to be close enough to the logic access transistors. As the pitches of lower metal layers aggressively scale in advanced technology nodes, embedding the capacitors in the lower metal layers poses significant challenges to the scaling of 1T-1C based memory.

Yet another challenge resides in that, given a usable surface area of a substrate, there are only so many FEOL transistors that can be formed in that area, placing a significant limitation on the density of memory cells of a memory array.

Embodiments of the present disclosure may improve on at least some of the challenges and issues described above. In contrast to the conventional memory approaches with FEOL transistors as described above, various embodiments of the present disclosure provide memory cells, arrays, and associated methods and devices, which use TFTs as access transistors of at least some of the memory cells. A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. This is different from conventional, non-TFT, FEOL logic transistors where the active semiconductor channel material is typically a part of a semiconductor substrate, e.g., a part of a silicon wafer. Using TFTs as access transistors of memory cells provides several advantages and enables unique architectures that were not possible with conventional, FEOL logic transistors.

One advantage is that a TFT may have substantially lower leakage than a logic transistor, allowing to relax the demands on the large capacitance placed on a capacitor of a 1T-1C memory cell. In other words, using a lower leakage TFT in a 1T-1C memory cell allows the memory cell to use a capacitor with lower capacitance and smaller aspect ratio while still meeting the same data retention requirements of other approaches, alleviating the scaling challenges of capacitors.

In addition, access TFTs may be moved to the back end of line (BEOL) layers of an advanced complementary metal oxide semiconductor (CMOS) process, which means that their corresponding capacitors can be implemented in the upper metal layers with correspondingly thicker interlayer dielectric (ILD) and larger metal pitch to achieve higher capacitance. This eases the integration challenge introduced by embedding the capacitors. Furthermore, when at least some access transistors are implemented as TFTs, at least portions of different memory cells may be provided in different layers above a substrate, thus enabling a stacked architecture of memory arrays. In this context, the term "above" refers to being further away from the substrate or the FEOL of an IC device (e.g. the IC device 100 shown in FIG. 1), while the term "below" refers to being closer towards the substrate or the FEOL of the IC device. Still further, when access transistors are implemented as TFTs, memory cells may be provided on both sides of a substrate, and at least portions of some memory cells may be provided in different layers on each side of the substrate.

According to one aspect of the present disclosure, an example IC device includes a support structure (e.g., a substrate) on which one or more logic devices may be implemented in, e.g., a FEOL layer. The IC device further includes a first memory cell in a first layer over the support structure, and a second memory cell in a second layer over the support structure, where each of the first memory cell and the second memory cell includes a respective TFT as an access transistor (i.e., the first and second memory cells include respective TFTs as their respective access transistors). The support structure with the layer of logic devices is between the first layer and the second layer of memory cells, or, phrased differently, the first memory cell is in a layer on one side and the second memory cell is in a layer on the other side of the support structure (or of the layer of logic devices). In various embodiments, the IC device may have further layers on one or both sides of the support structure, where further layers include additional TFT based memory cells.

Providing TFT based memory cells on both sides of a layer of logic devices as described herein allows significantly increasing density of memory cells in a memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the memory array with a given memory cell density. Furthermore, by embedding at least some, but preferably all, of the TFT based access transistors and the corresponding capacitors in the upper metal layers (i.e., in layers away from the support structure) on one or both sides of the support structure, according to at least some embodiments of the present disclosure, the peripheral circuits that control the memory operation can be hidden below the memory area to substantially reduce the memory macro array (i.e., the footprint area in the x-y plane of an example coordinate system shown in the drawings of the present disclosure).

Other technical effects will be evident from various embodiments described here. TFT based memory arrays with memory cells on both sides of a layer of logic devices as described herein may be used, for example, to address the scaling challenge of logic transistor (e.g., FEOL) based 1T-1C memory technology and enable high density embedded memory compatible with an advanced CMOS process. In one or more embodiments of the present disclosure, memory cells may use low-leakage access TFTs as row selection transistors (i.e., access transistors) and metal-insulator-metal (MIM) capacitors to store the data (e.g., to store one bit). By using an access transistor as a TFT embedded in a higher metal layer, e.g., as a TFT with a bottom-gate design or a TFT with a top gate design, the access transistor may be less susceptible to leakage than if it was formed in the FEOL portion of the IC, may be provided over a layer of other memory cells, and may be provided on both sides of a layer of logic devices.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

While some descriptions provided herein may refer to TFT based memory cells utilizing bottom-gate TFTs, embodiments of the present disclosure are not limited to only this design and include access TFTs for different memory cells being of various other architectures, or a mixture of different architectures. For example, in various embodiments, TFTs of various layers of memory cells on either side of a layer of logic devices, described herein, may include bottom-gated TFTs, top-gated TFTs, nanowire TFTs, etc., all of which being within the scope of the present disclosure. Furthermore, although descriptions of the present disclosure focus on TFT based memory cells provided on both sides of a layer of logic devices, IC devices described herein may also include other types of devices besides memory or other types of memory cells besides TFT based memory cells. For example, in some embodiments, IC devices with memory cells on both sides of a layer of logic devices may also include SRAM memory cells in any of the layers.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 5A-5H, such a collection may be referred to herein without the letters, e.g., as "FIG. 5."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with TFT based memory cells on both sides of a layer of logic devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Layering

FIG. 1 provides a schematic illustration of a cross-sectional view of an example IC device 100 with TFT based memory cells on both sides of a layer of logic devices, according to some embodiments of the present disclosure. FIG. 1 illustrates an example coordinate system 105 with axes x-y-z so that the various planes illustrated in FIG. 1 and in some subsequent FIGS. may be described with reference to this coordinate system. For example, the view shown in FIG. 1 is in the y-z plane, as indicated with y and z axes shown at the lower left corner of FIG. 1. The coordinate system 105 is not shown in subsequent FIGS. in order to not clutter the drawings.

As shown in FIG. 1, in general, the IC device 100 may include a carrier wafer 110, a first TFT memory layer 120 that includes one or more TFT based memory cells, a logic device layer 130, a substrate 140 (or, more generally, a support structure 140), a second TFT memory layer 150 that includes one or more TFT based memory cells, and a power and signal interconnect layer 160 that includes one or more electrical interconnects configured to provide power and/or signals to/from various components of the IC device 100 (e.g., to the logic devices in the logic device layer 130 and/or to the memory cells in the first or second memory layers 120, 150). The illustration of FIG. 1 is intended to provide a general orientation and arrangement of various layers with respect to one another, and, unless specified otherwise in the present disclosure, includes embodiments of the IC device 100 where portions of elements described with respect to one of the layers shown in FIG. 1 may extend into one or more, or be present in, other layers. For example, power and signal interconnects for the various components of the IC device 100 may be present in any of the layers shown in FIG. 1, not only in the power and interconnect layer 160.

The substrate 140 includes a first side (or face) 141 and a second side (or face) 142. The first TFT memory layer 120 may be provided over the first side 141, and the second TFT memory layer 150 may be provided over the second face 142. The logic device layer 130 may be a third layer that is provided between the substrate 140 and the first TFT memory layer 120, as shown in FIG. 1. In other embodiments of the IC device 100, the logic device layer 130 may be a third layer that is provided between the substrate 140 and the second TFT memory layer 150. Although two TFT memory layers are shown in FIG. 1, in various embodiments, the IC device 100 may include any other number of one or more of such TFT memory layers on each side of the substrate 130.

The first and second TFT based memory layers 120, 150 may, together, be seen as forming a memory array 190. As such, the memory array 190 may include low-leakage access TFTs, capacitors, as well as word-lines (e.g., row selectors) and bit-lines (e.g., column selectors), making up memory cells on both sides of a logic device layer as described in greater detail below. On the other hand, the logic device layer 130 may include various logic layers, circuits, and devices (e.g., logic transistors) to drive and control a logic IC. For example, the logic devices of the logic device layer 130 may form a memory peripheral circuit 180 to control (e.g., access (read/write), store, refresh) the memory cells of the memory array 190 that includes the first and second TFT based memory layers 120, 150.

In some embodiments, the logic device layer 130 may be provided in a FEOL with respect to the substrate 140. In some embodiments, the logic device layer 130 may be provided in a FEOL and in one or more lowest BEOL layers (i.e., in one or more BEOL layers which are closest to the substrate 140). The first TFT memory layer 120 and the second TFT memory layer 150 may be seen as provided in respective BEOL layers.

Various BEOL layers may be, or include, metal layers. Various metal layers of the BEOL may be used to interconnect the various inputs and outputs of the logic devices in the logic device layer 130 and/or of the TFT based memory cells in the memory cell layers 120, 150. Generally speaking, each of the metal layers of the BEOL may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of an adjacent metal layer. While referred to as "metal" layers, various layers of the BEOL may include only certain patterns of conductive metals, e.g., copper (Cu), aluminum (Al), Tungsten (W), or Cobalt (Co), or metal alloys, or more generally, patterns of an electrically conductive material, formed in an insulating medium such as an interlayer dielectric (ILD). The insulating medium may include any suitable ILD materials such as silicon oxide, carbon-doped silicon oxide, silicon carbide, silicon nitride, aluminum oxide, and/or silicon oxynitride.

Compared to conventional memory array designs that locate a memory control circuit in the same layers as a memory array but in a different macro (or x-y) area of the integrated circuit than the memory array (such as at a periphery of the memory array), the IC device 100 may advantageously locate the memory peripheral circuit 180 below the memory array 190 (i.e., closer to the substrate 140 than the memory layers of the memory array 190), e.g., substantially in the same x-y area as the memory array 190, thus saving valuable x-y area in the finished IC.

Example TFT Based Memory Cell

As described above, TFT based memory arrays with memory cells on both sides of a layer of logic devices as described herein may employ any suitable architecture for the memory cells, such as, but not limited to, 1T-1C memory cells, as well as any suitable architecture for the TFTs within the memory cells. FIGS. 2 and 3, described below, illustrate one specific arrangement of a memory cell with one specific type of a TFT, to provide a general illustration of a TFT based memory cells. However, in other embodiments, the memory cells built on both sides of a layer of logic devices as described herein may include any other types of memory cells and/or any other architectures of TFTs therein. Furthermore, while FIGS. 2 and 3 describe specific arrangements of word-lines and bit-lines with respect to the elements of the memory cell, in other embodiments, these arrangements may be different.

Figure 2A:
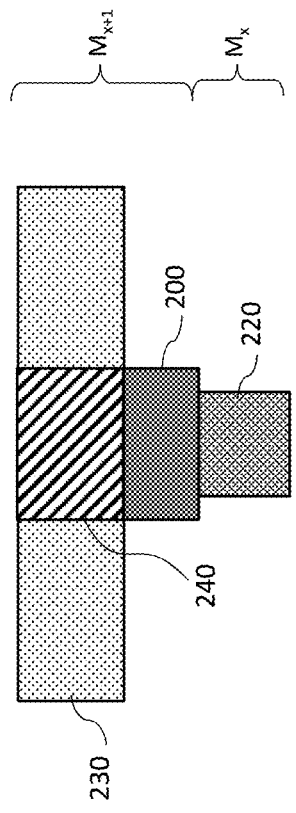
FIGS. 2A-2B are cross-sectional and plan views, respectively, of an example TFT based memory cell with an access TFT, according to some embodiments of the present disclosure.
Figure 2B:
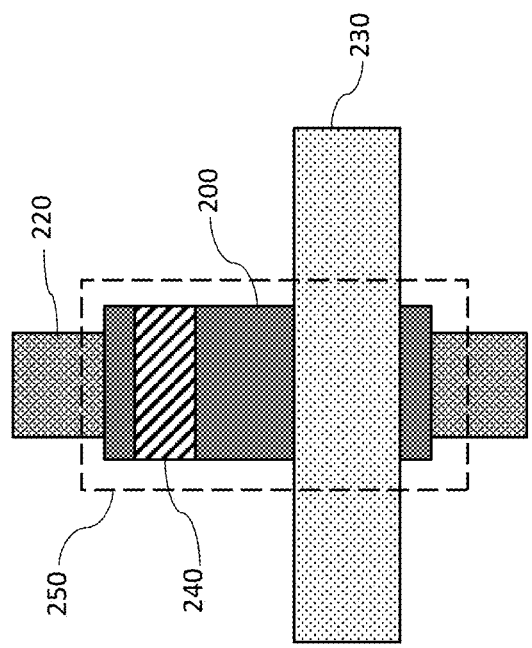

FIGS. 2A-2B are cross-sectional (y-z plane) and plan (y-x plane) views, respectively, of an example access TFT 200 of a given TFT based memory cell 250, according to some embodiments of the present disclosure. FIGS. 3A-3B are cross-sectional views (x-z and y-z planes) of an example structure of the access TFT 200 in the TFT based memory cell 250 of FIGS. 2A-2B, according to some embodiments of the present disclosure. The memory cell 250 shown in FIGS. 2 and 3 is an example of a memory cell that may be implemented to realize one or more of the memory cells of the first TFT based memory layer 120 and/or one or more of the memory cells of the second TFT based memory layer 150 of the IC device 100. In some embodiments of the IC device 100, multiple memory cells 250 may be arranged in a stacked architecture, i.e., when different memory cells such as the one shown in FIGS. 2 and 3 are stacked in different layers above the substrate 140.

As shown in FIG. 2, the TFT based memory cell 250 may include a word-line 220 to supply a gate signal, and the access TFT 200 that includes an channel layer and configured to control transfer of a memory state of the memory cell between a first region and a second region of the channel layer in response to the gate signal (channel layer and first and second regions described in greater detail below, e.g., with reference to FIG. 3). In some embodiments, the access TFT 200 may be provided above the word-line 220 coupled to the memory cell 250. As also shown in FIG. 2, the memory cell 250 may further include a bit-line 230 to transfer the memory state and coupled to the first region of the channel layer of the access TFT 200, and a storage node 240 coupled to the second region of the channel layer of the access TFT 200. Although not specifically shown in FIG. 2, the memory cell 250 further includes a capacitor, e.g., an MIM capacitor coupled to the storage node 240 and configured to store the memory state of the memory cell 250.

Turning to the details of FIG. 2, the access TFT 200 in the memory cell 250 may be coupled to or controlled by word-line 220, which, in some embodiments, may serve as the gate of the access TFT 200. A bit-line 230 may be coupled to one of the S/D electrodes (which may also be referred to as "contacts" or "terminals") of the access TFT 200 and a storage node 240 may be coupled to the other one of the S/D electrodes. As is commonly known, source and drain terminals are interchangeable in transistors. Therefore, while some examples and illustrations may be presented here with reference to the bit-line 230 coupled to the drain terminal and the storage node 240 coupled to the source terminal of the access TFT 200, in other embodiments, this may be reversed. For the following explanations, assume that the bit-line 230 may serve as the drain contact and the storage node 240 may serve as the source contact of the access TFT 200. The bit-lines 230 can be connected to sense amplifiers and other bit-line drivers which may, e.g., be provided in the memory peripheral circuit 180 associated with the memory array 190. In some embodiments, for a given memory cell 250, the word-line 220 may be formed in a metal layer Mx (where x is an integer indicating a specific layer), while the access TFT 200, the storage node 240, and the bit-line 230 may be formed in a metal layer Mx+1, i.e., the metal layer above the metal layer Mx, e.g. directly above the metal layer Mx (as illustrated in FIGS. 2 and 3). A capacitor of the memory cell 250 may be formed in a metal layer Mx+2, e.g. directly above the metal layer Mx+1.

FIGS. 3A-3B illustrate further details of the access TFT 200. As shown in FIGS. 3A-3B, in some embodiments, the access TFT 200 may be provided substantially above the word-line 220. In some embodiments, the access TFT 200 may be a bottom-gated TFT in that its gate stack comprising a gate dielectric 216 and a gate electrode 214 may be provided below its channel layer (also referred to as "active layer") 218, e.g., between the channel layer 218 and the word-line 220, and the channel layer 218 may be between the gate stack and the bit-line 230 forming one of the S/D terminals, e.g., the drain terminal, of the access TFT 200 and the storage node 240 forming another one of the S/D terminals, e.g., the source terminal, of the access TFT 200 (again, in other embodiments, this example designation of S/D terminals may be reversed). Thus, the word-line 220 may be between the substrate 140 and the gate electrode 214, and the bit-line 230 may be further away from the substrate 140 than the channel layer 218.

The channel layer 218 may be composed of semiconductor material systems including, for example, N-type or P-type materials systems. In some embodiments, the channel layer 218 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel layer 218 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 218 may be formed of a thin film material. Some such materials may be deposited at relatively low temperatures, which allows depositing them within the thermal budgets imposed on back end fabrication to avoid damaging the front end components such as the logic devices of the layer 130. In some embodiments, the channel layer 218 may have a thickness between about 5 and 75 nanometers, including all values and ranges therein.

The S/D electrodes of the access TFT 200, shown in various figures as provided by the corresponding bit-line 230 and the source node 240, respectively, may include any suitable electrically conductive material, alloy, or a stack of multiple electrically conductive materials. In some embodiments, the S/D electrodes of the access TFT 200 may include one or more metals or metal alloys, with metals e.g., copper, ruthenium, palladium, platinum, cobalt, nickel, hafnium, zirconium, titanium, tantalum, and aluminum, tantalum nitride, tungsten, doped silicon, doped germanium, or alloys and mixtures of these. In some embodiments, the S/D electrodes of the access TFT 200 may include one or more electrically conductive alloys, oxides, or carbides of one or more metals. In some embodiments, the S/D electrodes of the access TFT 200 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes of the access TFT 200 may have a thickness (i.e., dimension measured along the z-axis of the example coordinate system shown in the present drawings) between about 2 nanometers and 1000 nanometers, preferably between about 2 nanometers and 100 nanometers.

A gate dielectric 216 may laterally surround the channel layer 218, and the gate electrode 214 may laterally surround the gate dielectric 216 such that the gate dielectric 216 is disposed between the gate electrode 214 and the channel layer 218. In various embodiments, the gate dielectric 216 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 216 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 216 during manufacture of the access TFT 200 to improve the quality of the gate dielectric 216. In some embodiments, the gate dielectric 216 may have a thickness between about 0.5 nanometers and 3 nanometers, including all values and ranges therein, e.g., between about 1 and 3 nanometers, or between about 1 and 2 nanometers.

In some embodiments, the gate dielectric 216 may be a multilayer gate dielectric, e.g., it may include any of the high-k dielectric materials in one layer and a layer of IGZO. In some embodiments, the gate stack (i.e., a combination of the gate dielectric 216 and the gate electrode 214) may be arranged so that the IGZO is disposed between the high-k dielectric and the channel layer 218. In such embodiments, the IGZO may be in contact with the channel layer 218, and may provide the interface between the channel layer 218 and the remainder of the multilayer gate dielectric 216. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

The gate electrode 214 may include at least one P-type work function metal or N-type work function metal, depending on whether the access TFT 200 is a P-type metal oxide semiconductor (PMOS) transistor or an N-type metal oxide semiconductor (NMOS) transistor. For a PMOS transistor, metals that may be used for the gate electrode 214 may include, but are not limited to, ruthenium, palladium, platinum, cobalt, nickel, and conductive metal oxides (e.g., ruthenium oxide). For an NMOS transistor, metals that may be used for the gate electrode 214 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 214 may include a stack of two or more metal layers, where one or more metal layers are work function metal layers and at least one metal layer is a fill metal layer. Further metal layers may be included for other purposes, such as to act as a diffusion barrier layer, described below.

FIGS. 3A-3B further illustrate that the bottom-gated access TFT 200 may further, optionally, include layers such as a diffusion barrier layer 212, which may be surrounded by a layer of etch resistant material (e.g., an etch stop layer 211). In some embodiments, the diffusion barrier 212 may be a metal- or copper-diffusion barrier (e.g., a conductive material to reduce or prevent the diffusion of metal or copper from word-line 220 into the gate electrode 214 while still maintaining an electrical connection between the word-line 220 and the gate electrode 214) on the word-line 220 such as TaN, tantalum (Ta), titanium zirconium nitride (e.g., TiXZr1-XN, such as X=0.53), titanium nitride (e.g., TiN), titanium tungsten (TiW), combination (such as a stack structure of TaN on Ta), or the like. For instance, the diffusion barrier 212 can include a single- or multilayer structure including a compound of tantalum (Ta) and nitrogen (n), such as TaN or a layer of TaN on a layer of Ta. In some embodiments, a layer of etch resistant material (e.g., the etch stop 211) such as silicon nitride or silicon carbide may be formed over the word-line 220 with vias for a metal (or copper) diffusion barrier film 212 such as TaN or a TaN/Ta stack. The gate electrode 214 can be a conductive material on the diffusion barrier 212, such as metal, conductive metal oxide or nitride, or the like. For example, in one embodiment, the gate electrode 214 may be titanium nitride (TiN). In another embodiment, the gate electrode 214 may be tungsten (W).

The channel layer 218 can be in contact with the storage node 240 (e.g., at a first region of the channel layer 218, such as a source region) and with the bit-line 230 (e.g., at a second region of the channel layer 218, such as a drain region, with a semi-conductive channel region between the first region and the second region). In some embodiments, such a channel region may include only majority carriers in the thin film. Accordingly, the channel layer 218 may require a relatively high bias (as e.g., supplied by the word-line 220, diffusion barrier film 212, and gate electrode 214) to activate.

Example Fabrication Method

IC devices with TFT based memory cells on both sides of a layer of logic devices, as described herein, may be fabricated using any suitable techniques, e.g., subtractive, additive, damascene, dual damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

Figure 4:
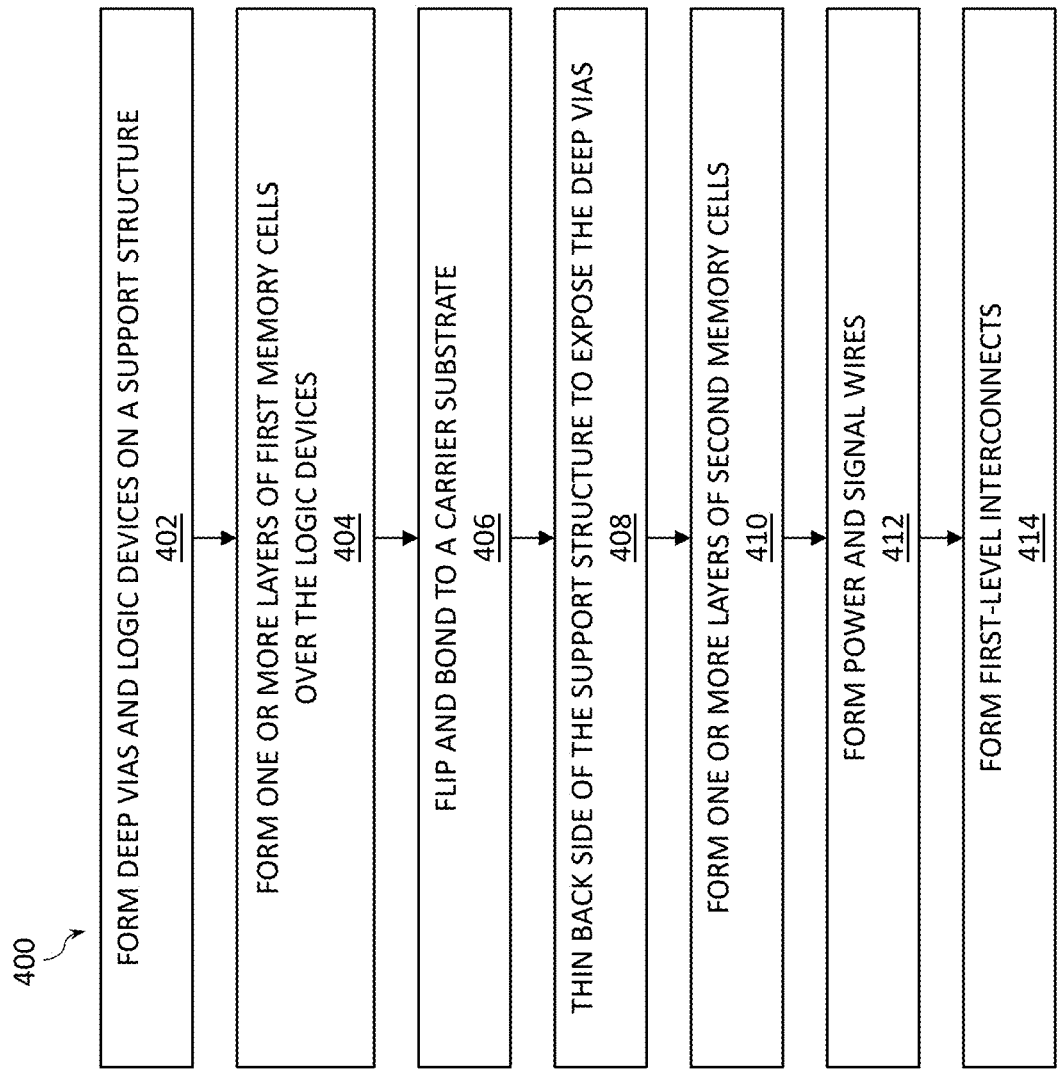
FIG. 4 illustrates an example method of forming an IC device with TFT based memory cells on both sides of a layer of logic devices, according to some embodiments of the present disclosure.

FIG. 4 illustrates an example method 400 of forming an IC device with TFT based memory cells on both sides of a layer of logic devices, according to some embodiments of the present disclosure. FIGS. 5A-5H illustrate cross-sectional side views for various stages in the manufacture of an example IC device (e.g., the IC device 100 as shown in FIG. 1) according to the method 400 of FIG. 4, in accordance with some embodiments. In particular, each of FIGS. 5A-5H illustrates a cross-section of the IC device taken along the x/y-z plane of the reference coordinate system x-y-z shown in FIG. 1.

In FIGS. 5A-5H, only one of certain elements may be labeled with a reference numeral but several of those may be illustrated. A number of elements labeled in FIGS. 5A-5H with reference numerals are illustrated in these figures with different patterns, with a legend showing the correspondence between the reference numerals and patterns being provided at the bottom of each drawing page containing FIGS. 5A-5H. For example, the legend illustrates that FIGS. 5A-5H use different patterns to show a support structure 520, logic devices 522, deep vias 524, TFT based memory cells 528, etc. Furthermore, although a certain number of a given element may be illustrated in 5A-5H (e.g., 7 deep vias 524), this is also simply for ease of illustration, and more, or less, than that number may be included in an IC device according to various embodiments of the present disclosure. Still further, various IC device views shown in FIGS. 5A-5H are intended to show relative arrangements of various elements therein, and that various IC devices, or portions thereof, may include other elements or components that are not illustrated (e.g., specific power and signal interconnects to various devices, such as the logic devices 522 or TFT based memory cells 528, are not illustrated).

Although some of the manufacturing operations of the method 400 may be discussed below with reference to particular embodiments of the IC device as shown in FIG. 1 or the TFT based memory cells as shown in FIG. 2 and FIG. 3, at least some of these operations and/or operations with minor modifications may be applied to manufacturing many different embodiments of the IC devices with TFT based memory cells on both sides of a layer of logic devices as discussed herein.

In addition, although the operations of the method 400 are illustrated in FIG. 4 once each and in a particular order, the operations may be performed in any suitable order and repeated as desired. For example, one or more operations may be performed in parallel to manufacture multiple TFT based memory cells and/or to manufacture multiple stacked TFT based memory arrays as described herein substantially simultaneously. In another example, the operations may be performed in a different order to reflect the architecture of a particular device component in which one or more TFT based memory cells on both sides of a layer of logic devices as described herein are to be included. In yet another example, some operations may be combined into a single operation, and some operations may be subdivided into more operations than what is shown in FIG. 4.

Furthermore, the method 400 may also include operations not specifically shown in FIG. 4. In one example, such operations may include various cleaning operations as known in the art. For example, in some embodiments, device assemblies may be cleaned prior to and/or after any of the processes of the method 400 described herein, e.g. to remove surface-bound organic and metallic contaminants, as well as subsurface contamination, to promote adhesion, and/or to decrease interdiffusion of materials. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In some embodiments, cleaning may be carried out using chemical or plasma clean, or applying heat in a controlled environment. In another example, in some embodiments, device assemblies may be planarized/polished before or after each of the processes shown in FIG. 4. Planarization may be performed using either wet or dry planarization processes. In one embodiment, planarization may be performed using chemical mechanical planarization (CMP), which may be understood as a process that utilizes a polishing surface, an abrasive and a slurry to remove the overburden of one or more materials which may cover upper surfaces of the assemblies, e.g., to expose surfaces of underlying materials for subsequent etch.

Turning to FIG. 4, the method 400 may begin a process 402 that involves forming deep vias in a support structure and logic devices (e.g., transistors, capacitors, resistors, and the like) over a support structure. An IC device 502, depicted in FIG. 5A, illustrates an example result of the process 402. As shown in FIG. 5A, the IC device 502 may include a support structure 520, a plurality of logic devices 522, and a plurality of deep vias 524.

The support structure 502 may, e.g., be a substrate, a die, a wafer or a chip. The substrata may, e.g., be the wafer 2000 of FIG. 6A, discussed below, and may be, or be included in, a die, e.g., the singulated die 2002 of FIG. 6B, discussed below. The substrate may be a semiconductor substrate composed of semiconductor material systems including, for example, N-type or P-type material systems. The substrate may include, for example, a crystalline substrate formed using a bulk silicon or a silicon-on-insulator (SOI) structure. In some embodiments, the substrate may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V or group IV materials. Further materials classified as group II-VI or group III-V may also be used to form the substrate on which logic devices are formed in the process 402. In some embodiments, the substrate may be non-crystalline. In some embodiments, the substrate may be a printed circuit board (PCB) substrate. Although a few examples of materials from which the substrate for housing the logic devices may be formed are described here, any material that may serve as a foundation for the IC device 100 with a TFT based memory cells on both sides of a layer of logic devices as described herein may be used.

Any known processes may be used to form the logic devices 522 over the support structure 520 in the process 402, e.g., any know FEOL processes. The deep vias 524 may be formed using, e.g., a suitable etching process, possibly in combination with patterning, e.g., using a mask, to form openings in the support structure 520 and filling the openings with one or more electrically conductive materials.

For example, in some embodiments, the openings in the support structure 520 for forming the deep vias 524 may be formed using any suitable anisotropic etching technique (i.e., etching uniformly in a vertical direction) such as dry etch. In some embodiments, the deep vias may extend into the support structure 502 by a distance that is between about 100 nanometers and 100 micrometers, including all values and ranges therein, e.g., between about 100 and 1000 nanometers. In some embodiments, the deep vias may be a high aspect ratio structures in that their aspect ratio (i.e., their height divided by their width) may be larger than about 3, e.g., larger than about 10, larger than about 50.

The deep vias 524 may be made electrically conductive by filling the openings in the support structure 520 with any suitable electrically conductive material, alloy, or a combination of multiple electrically conductive materials. In some embodiments, electrically conductive materials used to fill the openings of the deep vias 524 in the process 402 may include one or more metals or metal alloys, with metals e.g., copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. These materials may be deposited using any suitable processes for providing electrically conductive materials, such as chemical vapor deposition (CVD), atomic layer deposition (ALD), physical vapor deposition (PVD), electroplating, or any combination of these techniques. In some embodiments, the deep vias 524 may be made electrically conductive by only lining the openings in the support structure 520 with an electrically conductive material, with the center of the lined openings being filled with a suitable insulating material. In such embodiments, the insulating materials may be deposited in the center of the lined openings using spin-coating, dip-coating, CVD, ALD, or any combination of these techniques. In some embodiments, any of the electrically conductive materials deposited in the process 402, e.g., to form the deep vias 524, may be covered by diffusion barriers or diffusion barrier layers to prevent or help preventing the diffusion or migration of the electrically conductive materials from their target locations to the rest of the IC device. In some embodiments, diffusion barrier materials may include dielectric layers, such as silicon nitride, silicon carbide, or the like, with vias filled with metal-diffusion barrier films like tantalum nitride (TaN), tantalum (Ta), titanium zirconium nitride (e.g., $Ti_xZr_{1-x}N$, such as X=0.53), titanium nitride (e.g., TiN), titanium tungsten (TiW), or the like.

The method 400 may then proceed with a process 404 that includes forming one or more layers of first memory cells over the layer of the logic devices 522. An IC device 504, depicted in FIG. 5B, illustrates an example result of the process 404. As shown in FIG. 5B, the IC device 504 may include a layer of a support material 526, and three layers of TFT based memory cells 528 over the layer of the logic devices 522. In other embodiments, any other number of layers of memory cells 528 may be used, and any of the layers may include any suitable number of the memory cells 528 other than what is shown in FIG. 5. In some embodiments, the support material 526 may include any suitable insulating material, e.g., any suitable ILD material.

Any known processes may be used to form the memory cells 528 over the logic devices 522 in the process 404, in any desired architecture, such as those shown in FIGS. 2 and 3. The exact order of the processes used to form the memory cells 528 may depend on the architecture of the memory cells 528, but some of the processes are described below in general, without referring to any specific order of these processes. Any of these processes may be performed in combination with a suitable patterning technique, possibly using a suitable mask.

In some embodiments, the process 404 may include depositing the support material 526 using, e.g., spin-coating, dip-coating, CVD, ALD, or any combination of these techniques.

In some embodiments, the process 404 may include depositing the TFT channel material for the memory cells 528. The TFT channel material for the memory cells 528 may include any of the materials described with reference to the material 218, and may be deposited using any suitable thin film deposition technique, e.g., sputtering, evaporation, ALD, CVD, PVD, molecular beam epitaxy (MBE), or pulsed laser deposition (PLD). The process 404 may include patterning the layer of the TFT channel material using any suitable patterning techniques, e.g., photolithographic or electron-beam patterning, possibly in combination with using a mask, e.g., a hardmask, and including a suitable etching process to remove portions of the channel material, e.g., using dry etch, wet etch, reactive ion etch (RIE), ion milling, etc.

In some embodiments, the process 404 may include depositing electrically conductive materials to form word-line, bit-lines, and any other electrically conductive structures that may be provided for interconnecting various portions of the memory cells 528. The word-line, bit-lines, and any other electrically conductive structures that may be provided in the process 404 for interconnecting various portions of the memory cells 528 (e.g., as described with reference to FIGS. 2 and 3) may include any suitable electrically conductive material, alloy, or a stack of multiple electrically conductive materials, such as those described above for the electrically conductive materials of the deep vias 524. In some embodiments, any of the electrically conductive structures formed in the process 404 may be deposited using any suitable processes for providing electrically conductive materials, e.g., ALD, CVD, PVD, or electroplating, e.g., in a damascene or a dual damascene process. In some embodiments, any of the electrically conductive materials deposited in the process 404 may be covered by diffusion barriers or diffusion barrier layers, such as those described above for the diffusion barrier materials of the deep vias 524.

In some embodiments, the process 404 may include depositing electrically conductive materials to form capacitor electrodes of the capacitors of the memory cells 528 and depositing a capacitor insulator material between the capacitor electrodes of the capacitors of the memory cells 528. In some embodiments, capacitors of the memory cells 528 may be metal-insulator-metal capacitors. In some embodiments, an MIM capacitor of a given memory cell 528 may be fabricated in the process 404 by etching (for example, by photolithography) deep, narrow openings (e.g., trenches) in the via portion of a given metal layer, and lining the openings with a thin layer of a first electrically conductive material to form one capacitor electrode, then a thin layer of an insulator material to form a capacitor insulator, and then depositing another electrically conductive material to form the other capacitor electrode. In some embodiments, the MIM capacitors of the memory cells 528 may be fabricated in a separate process from the rest of the metal layer fabrication, e.g., to account for its large height and possibly different electrode material from the rest of the metal layer. This may advantageously create a relatively large capacitance in the MIM capacitor by having a relatively large surface area for the terminals (i.e., the first and second capacitor electrodes) separated by a relatively small amount of insulation (i.e., the capacitor dielectric). The three layers of such a capacitor may be lined within the openings using any suitable conformal deposition technique, such as ALD or CVD. Conformal deposition generally refers to deposition of a certain coating on any exposed surface of a given structure. A conformal coating may, therefore, be understood as a coating that is applied to exposed surfaces of a given structure, and not, for example, just to the horizontal surfaces. In some embodiments, the coating may exhibit a variation in thickness of less than 35%, including all values and ranges from 1% to 35%, such as 10% or less, 15% or less, 20% of less, 25% or less, etc. For instance, the first capacitor electrode can be lined to a thickness of about 20-40 nanometers using a conductive material (e.g., metal, conductive metal nitride or carbide, or the like), followed by a thin dielectric (to increase capacitance, for example, about 3-40 nanometers), followed by the second capacitor electrode, which may have the same or different composition than the first capacitor electrode.

Figure 5C:
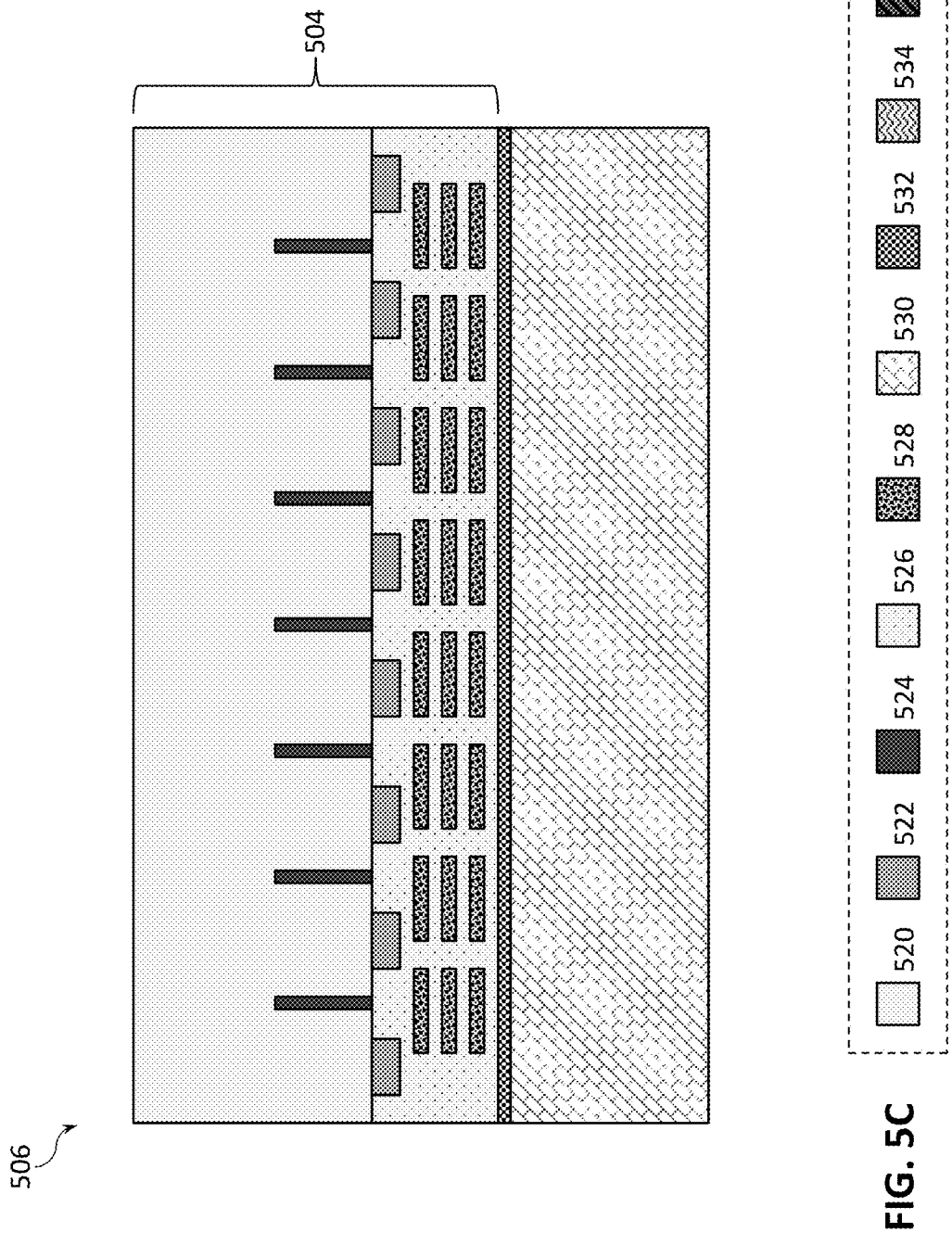

The method 400 may then proceed with a process 406 that includes flipping the IC device that was formed in the process 404 (e.g., the IC device 504) and bonding it to a carrier substrate. An IC device 506, depicted in FIG. 5C, illustrates an example result of the process 406. As shown in FIG. 5C, the IC device 506 may include the IC device 504, flipped upside down, and bonded to a carrier substrate 530 with a bonding material 532. In some embodiments, the carrier substrate 530 may be formed of a dielectric material (e.g., a ceramic, a buildup film, an epoxy film having filler particles therein, etc.), a silicon wafer, or a glass wafer. For example, the carrier substrate 530 may be implemented as the package substrate 2252, shown in FIG. 8. The bonding material 532 may include any suitable adhesive to ensure attachment of the IC device that was formed in the process 404 to the carrier substrate 530. Some examples of the bonding material 532 include epoxies typically used in so-called thermos-compression bonding, or dielectrics commonly used in so-called molecular bonding, such as SiO2, doped silicon oxide, Si3N4, doped silicon nitrides, or metals such as Cu. In other embodiments, hybrid bonding may be used, in which conductors and dielectrics are part of the bonding surface.

Figure 5D:
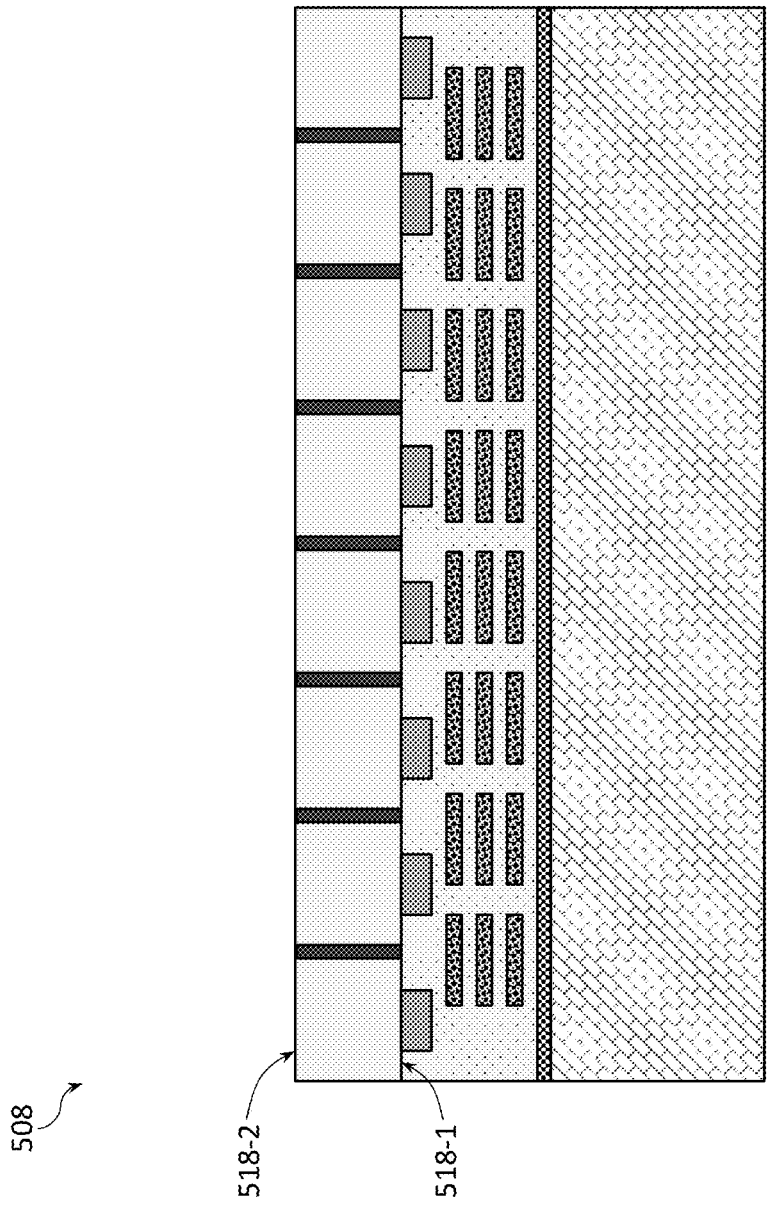

Next, the method 400 may include a process 408 in which the back side of the support structure 520 is thinned to expose the deep vias 524. An IC device 508, depicted in FIG. 5D, illustrates an example result of the process 408. As shown in FIG. 5D, a portion of the back side of the support structure 520 of the IC device 508 has been removed so that the deep vias 524 now extend between a first face 518-1 of the support structure 520 and a second face 518-2 of the support structure, the second face 518-2 being opposite the first face 518-1. Thinning of the back side of the support structure 520 may be performed using, e.g., a CMP process. Although not specifically shown in the present drawings, in some embodiments, once the back side of the support structure 520 has been thinned to expose the deep vias 524, the process 408 may further include removing at least portions, or all, of the material of the support structure 520, while leaving the deep vias 524. After that, the openings created by the removal of the material of the support structure 520 may be filled with another material, or a combination of materials, e.g. with a dielectric material (e.g., any of the dielectric materials described herein). Further processes of the method 400 may then proceed with as described below, except for that the IC device would look different from what is shown in FIGS. 5D-5H because at least a portion of the material of the support structure 520 could be replaced with another material, all of which embodiments being within the scope of the present disclosure. In some embodiments, removing at least portions, or all, of the material of the support structure 520 that is in between the deep vias 524 may be performed using selective etching, i.e., using an etching process with etchants that would etch the material of the support structure 520 while not substantially etching the material of the deep vias 524, thus leaving the deep vias 524 substantially intact. Subsequently filling the openings created by the selective etch with another material may be performed using any suitable process for depositing such materials, e.g., spin-coating, dip-coating, ALD, CVD, or PVD.

Figure 5E:
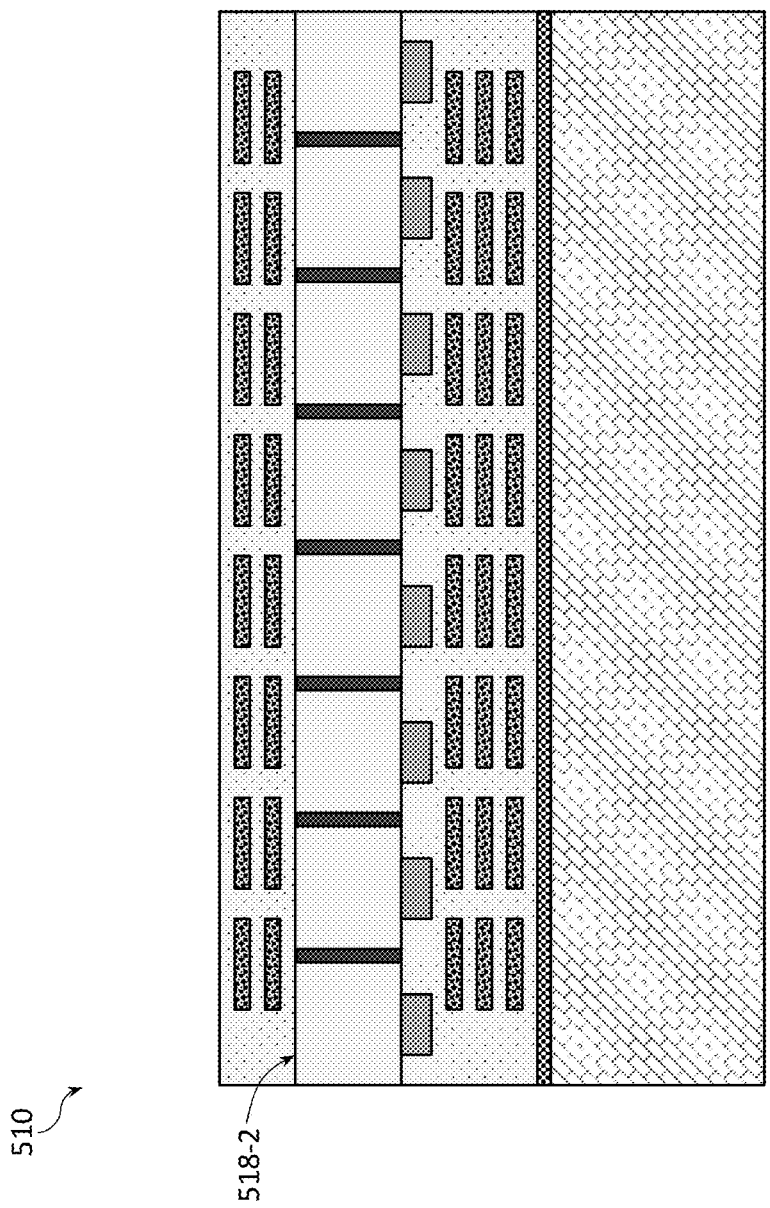

The method 400 may then proceed with a process 410 that includes forming one or more layers of second memory cells over the second face 518-2 of the thinned support structure 520. An IC device 510, depicted in FIG. 5E, illustrates an example result of the process 410. As shown in FIG. 5E, the IC device 510 may include a layer of the support material 526, and two layers of the TFT based memory cells 528 over the second face 518-2 of the thinned support structure 520. In other embodiments, any other number of layers of memory cells 528 may be used, and any of the layers may include any suitable number of the memory cells 528 other than what is shown in FIG. 5.

Although the same support material 526 is illustrated on both sides of the support structure 520 in FIG. 5E and subsequent figures, in some embodiments, the exact material composition of the support material 526 may be different on different sides. Similarly, although the same TFT based memory cells 528 are illustrated on both sides of the support structure 520 in FIG. 5E and subsequent figures, in some embodiments, these memory cells may be different in their architecture/structure and/or material composition of various components therein. Descriptions provided above with respect to forming the one or more layers of first memory cells over the layer of logic devices in the process 404 are applicable to forming the one or more layers of second memory cells in the process 410 and, therefore, in the interests of brevity, are not repeated here.

The method 400 may then proceed with a process 412 that includes forming one or more power and signal wires. An IC device 512, depicted in FIG. 5F, illustrates an example result of the process 412, where some exemplary power and signal wires 534 are shown. While the IC device 512 illustrates the power and signal wires 534 being provided in a layer above the memory cells 528 on the back side of the support structure 520, in general, the power and signal wires 534 may be provided in any other layers shown in FIG. 5, and on either side of the logic devices 522. The power and signal wires 534 may include any suitable interconnects, such as vias and trenches, made of any suitable electrically conductive material, to provide electrical connectivity between various memory cells 528 on the back side of the support structure 520. Furthermore, the deep vias 524 may provide electrical connectivity from the power and signal wires 534 and/or various memory cells 528 on the back side of the support structure 520 (i.e., the memory cells formed in the process 410) to various memory cells 528 on the front side of the support structure 520 (i.e., the memory cells formed in the process 404). The power and signal wires 534 may be formed of any suitable electrically conductive materials, such as those described above, and using any of the suitable techniques which have also been described above.

Figure 5G:
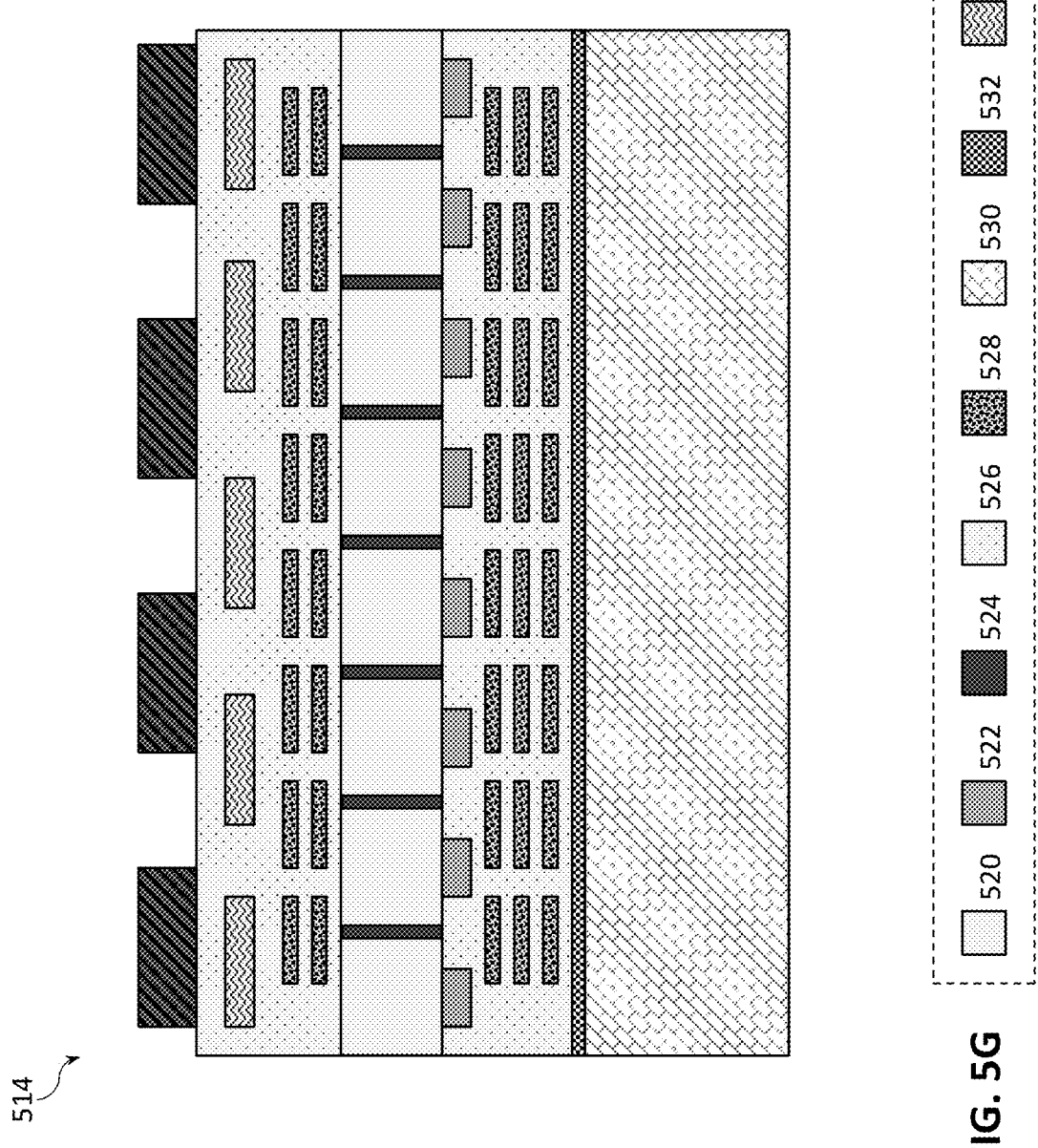

The method 400 may conclude with a process 414 that includes forming one or more first-level interconnects for electrically coupling the IC device formed in the processes 402-412 to one or more further electronic components. An IC device 514, depicted in FIG. 5G, illustrates an example result of the process 414, where some exemplary first-level interconnects 536 are shown. The first-level interconnects 536 may be electrically coupled with the interconnect structures of the IC device 514 and configured to route the electrical signals of the transistor(s) of the logic devices 522 and of the memory cells 528 to other external devices. For example, the first-level interconnects 536 may be formed to mechanically and/or electrically couple a chip including the IC device 514 with another component (e.g., a circuit board). In some embodiments, the first-level interconnects 536 may be solder bumps, solder balls, pins, pillars of electrically conductive material, or any other structures of one or more electrically conductive materials (e.g., metal), for serving as an interface between the IC device 514 and one or more further electronic components. Further electronic components may, e.g., include dies with other ICs provided therein, a package substrate, another IC devices or packages, an interposer, a circuit board (e.g., a motherboard), power and signal sources, and so on. Although not specifically shown in FIG. 5G, in some embodiments, the IC device 514 may include a solder resist material (e.g., polyimide or similar material) provided in between one or more of the first-level interconnects 536.

Figure 5H:
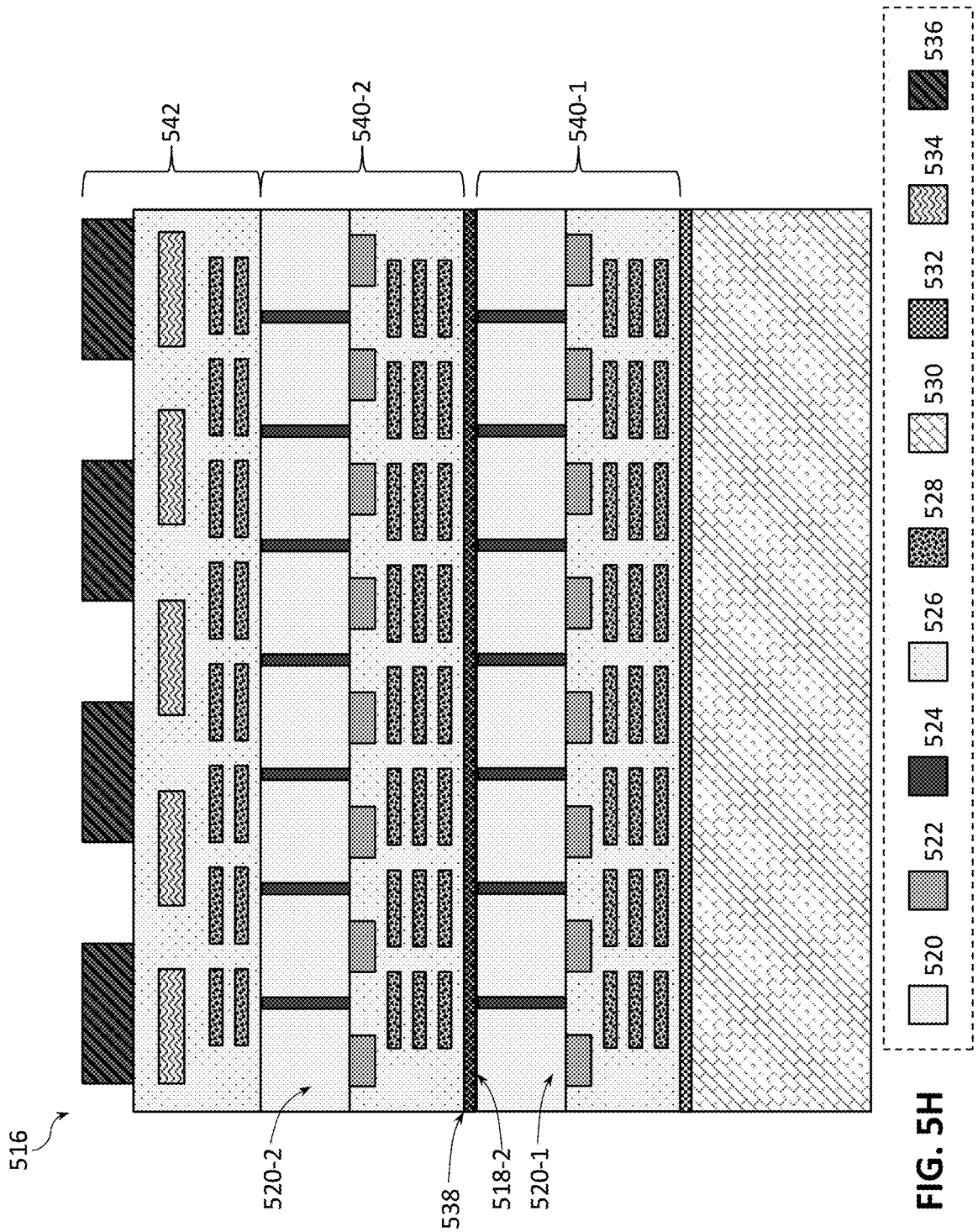

FIG. 5H illustrates that, in some embodiments, multiple support structures with deep vias, logic devices and memory cells may be bonded together. To that end, in some embodiments, processes 402-404 may be repeated, with minor modifications, on one or more further support structures and bonded, in a flip arrangement, to the IC device that is the result of, e.g., the process 408. This is what is shown with an IC device 516 of FIG. 5H. Namely, portion 540-1 of the IC device 516 is what may be fabricated in the processes 402-404 on a first support structure 520-1 (which is a first instance of the support structure 520, described above), and then flipped and bonded to the carrier substrate 530 in the process 406. After that, another portion similar to the portion 540-1, shown in FIG. 5H as a portion 540-2, may be fabricated by performing the processes 402-404 on a second support structure 520-2 (which is a second instance of the support structure 520, described above), and then flipped and bonded to the portion 540-1 in a process similar to the process 406 except that the bonding is now not to the carrier substrate 530 but to the second face 518-2 of the first support structure 520-1. Another modification is that bonding of the portion 540-2 to the portion 540-1 should be made in such a manner that electrical connections can be made between these two portions. Therefore, FIG. 5H illustrates a bonding layer 538 between the portions 540-2 and 540-1, which may be similar to the bonding layer 532, but, unlike the bonding layer 532 which may but does not have to support electrical connections, the bonding layer 538 is configured to support electrical connections between the portions 540-2 and 540-1. For example, in some embodiments, hybrid bonding may be used to form the bonding layer 538, where the layer 538 would have both electrically conductive and dielectric materials, in which the electrically conductive materials support electrical connections. After that, the processes 410-414 may be carried out to form a portion 542 shown in FIG. 5H. To summarize, electrical connectivity between various devices (e.g., logic devices 522, various memory cells 528, power and signal interconnects 534, etc.) above the carrier substrate 530 may be supported by means of having the deep vias extending through each of the support structures 520 as through-silicon-vias (TSVs, although the material of the support structures 520 is not limited to silicon). Furthermore, when multiple portions 540 are stacked over the carrier substrate 534, electrical connectivity between the different portions 540 may be supported by means of having bonding layers 538 that include electrical connections.

Variations and Implementations

Various device assemblies illustrated in FIGS. 1-5H do not represent an exhaustive set of IC devices with TFT based memory cells on both sides of a layer of logic devices as described herein, but merely provide examples of such devices/structures/assemblies. In particular, the number and positions of various elements shown in FIGS. 1-5H is purely illustrative and, in various other embodiments, other numbers of these elements, provided in other locations relative to one another may be used in accordance with the general architecture considerations described herein. For example, in some embodiments, some processes of the method 400 may be repeated multiple times in a similar manner to what is described with reference to FIG. 5H to include additional support structures with logic devices and/or memory cells in the IC device 516. In another example, in some embodiments when multiple instances of the support structure with the logic devices 522 and/or memory cells 528 are bonded together, the logic devices 522 may be included on some support structures but not others (e.g., in other embodiments of the IC device 516, the logic devices 522 may be absent on the support structure 520-1 but present on the support structure 520-2, or the logic devices 522 may be absent on the support structure 520-2 but present on the support structure 520-1). In some embodiments when multiple instances of the support structure with the logic devices 522 and/or memory cells 528 are bonded together, some support structures may only be provided with the logic devices 522 but not with the memory cells 528, and/or some support structures may only be provided with the memory cells 528 but not with the logic devices 522. In various embodiments, one or more logic devices 522 may be included in other portions of the IC devices described herein, e.g., in between the memory cells 528 on one or both faces of the support structure 520.

Further, FIGS. 1-3 and 5 are intended to show relative arrangements of the elements therein, and the device assemblies of these figures may include other elements that are not specifically illustrated (e.g., various interfacial layers). Similarly, although particular arrangements of materials are discussed with reference to FIGS. 1-3 and 5, intermediate materials may be included in the IC devices and assemblies of these figures. Still further, although some elements of the various top down and cross-sectional views are illustrated in FIGS. 1-3 and 5 as being planar rectangles or formed of rectangular solids, this is simply for ease of illustration, and embodiments of these assemblies may be curved, rounded, or otherwise irregularly shaped as dictated by, and sometimes inevitable due to, the manufacturing processes used to fabricate semiconductor device assemblies.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the TFT based memory cells on both sides of a support structure as described herein.

Example Electronic Devices

Arrangements with IC devices with TFT based memory cells on both sides of a layer of logic devices as disclosed herein may be included in any suitable electronic device. FIGS. 6-10 illustrate various examples of devices and components that may include one or more IC devices with TFT based memory cells on both sides of a layer of logic devices as disclosed herein.

Figures 6A, 6B:
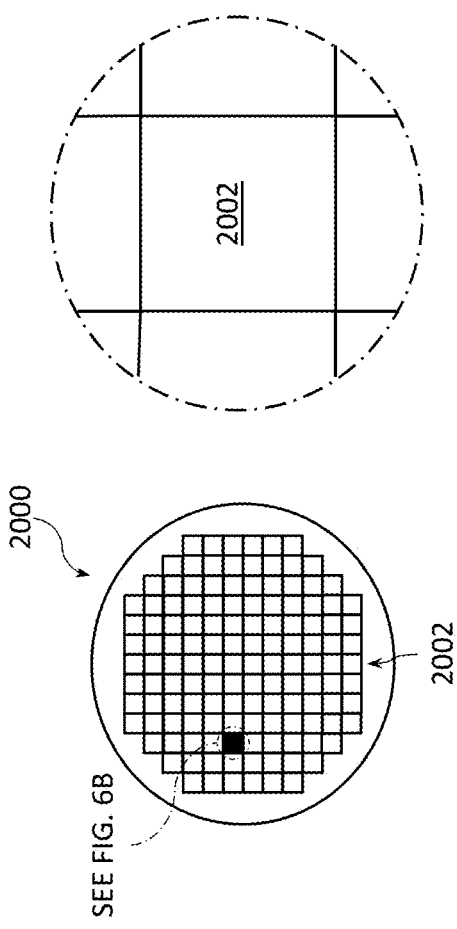
FIGS. 6A-6B are top views of a wafer and dies that include TFT based memory cells on both sides of a layer of logic devices in accordance with any of the embodiments disclosed herein.

FIGS. 6A-6B are top views of a wafer 2000 and dies 2002 that may include one or more IC devices with TFT based memory cells on both sides of a layer of logic devices in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including TFT based memory cells on both sides of a layer of logic devices as described herein). After the fabrication of the semiconductor product is complete (e.g., after manufacture of TFT based memory cells on both sides of a layer of logic devices as described herein, e.g. any embodiment of the IC devices 100, 514, or 516, described herein), the wafer 2000 may undergo a singulation process in which each of the dies 2002 is separated from one another to provide discrete "chips" of the semiconductor product. In particular, devices that include TFT based memory cells on both sides of a layer of logic devices as disclosed herein may take the form of the wafer 2000 (e.g., not singulated) or the form of the die 2002 (e.g., singulated). The die 2002 may include one or more transistors (e.g., one or more transistors included in the logic devices 522 as described herein and/or one or more FEOL transistors 2140 of FIG. 7, discussed below) and/or supporting circuitry to route electrical signals to the transistors and/or the memory cells (e.g., the memory cells 528 as described herein), as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory cells in a given layer may be formed on a same die 2002 as a processing device (e.g., the processing device 2402 of FIG. 10) or other logic that is configured to store information in the memory devices or execute instructions stored in the memory array.

Figure 7:
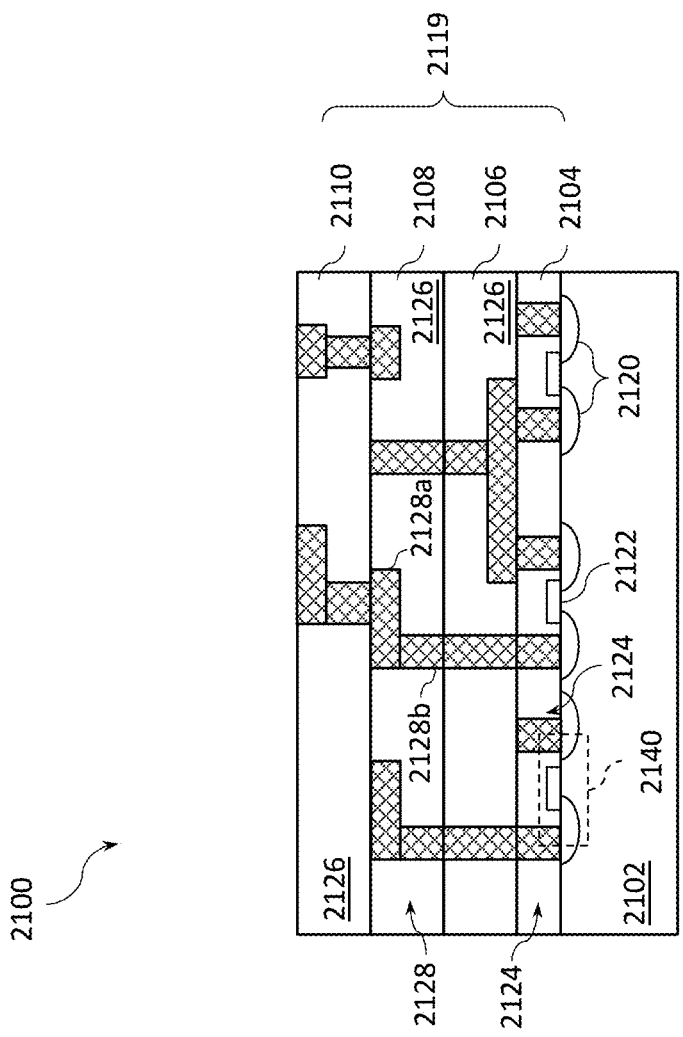
FIG. 7 is a cross-sectional side view of one side of an IC device that may include TFT based memory cells on both sides of a layer of logic devices in accordance with any of the embodiments disclosed herein.

FIG. 7 is a cross-sectional side view of one side of an IC device 2100 that may include TFT based memory cells on both sides of a layer of logic devices in accordance with any of the embodiments disclosed herein. For example, the IC device 2100 may be, or may include, the IC device 100, described above, in particular to implement what may be provided on the first face 518-1 of the support structure 520 (e.g., in the IC device 504, or the portions 540-1, 540-2), described herein. In particular, the memory cells 528 as described herein may be implemented in any of the BEOL layers of the IC device 2100, e.g., in any of the interconnect layers 2106-2110 shown in FIG. 7. Because there are various possibilities where such TFT based memory cells may be integrated in the IC device 2100, the memory cells 528 are not specifically shown in FIG. 7. For example, in some embodiments, TFT based memory cells as described herein may be included above the interconnect layers 2106-2110 of the IC device 2100. In another example, at least some of the TFT based memory cells as described herein may be included within one or more of the interconnect layers 2106-2110 of the IC device 2100. In some embodiments, the IC device 2100 may serve as any of the dies 2256 in the IC package 2300.

As shown in FIG. 7, the IC device 2100 may be formed on a substrate 2102 (e.g., the wafer 2000 of FIG. 6A) and may be included in a die (e.g., the die 2002 of FIG. 6B). The substrate 2102 may include any material that may serve as a foundation for an IC device 2100. The substrate 2102 may be a semiconductor substrate, and may include any of the examples described above with reference to the support structure 520 (the deep vias 524 are not specifically illustrated in the substrate 2102 in order to not clutter the drawing). Although a few examples of the substrate 2102 are described here, any material or structure that may serve as a foundation upon which an IC device 2100 may be built falls within the spirit and scope of the present disclosure.

The substrate 2102 may be part of a singulated die (e.g., the die 2002 of FIG. 6B) or a wafer (e.g., the wafer 2000 of FIG. 6A).

The IC device 2100 may include one or more device layers 2104 disposed on the substrate 2102. The device layers 2104 provide one example of one or more layers with the logic devices 522, described above. The device layer 2104 may include features of one or more transistors 2140 (e.g., metal oxide semiconductor field-effect transistors (MOSFETs)) formed on the substrate 2102. The transistors 2140 provide one example of any of the logic devices 522, described above The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 216. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 214.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 7 and may include a wide variety of other types and configurations such as, for example, planar transistors, non-planar transistors (e.g., Fin-FETs, nanowire, or nanoribbon transistors), or a combination of both.

Electrical signals, such as power and/or input/output (I/O) signals, may be routed to and/or from the transistors 2140 of the device layer 2104 through one or more interconnect layers disposed on the device layer 2104 (illustrated in FIG. 7 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 7). Although a particular number of interconnect layers 2106-1210 is depicted in FIG. 7, embodiments of the present disclosure include IC devices having more or fewer interconnect layers than depicted.

In some embodiments, the interconnect structures 2128 may include trench structures 2128*a* (sometimes referred to as "lines") and/or via structures 2126B (sometimes referred to as "holes") filled with an electrically conductive material such as a metal. The trench structures 2128*a* may be arranged to route electrical signals in a direction of a plane that is substantially parallel with a surface of the substrate 2102 upon which the device layer 2104 is formed. For example, the trench structures 2128*a* may route electrical signals in a direction in and out of the page from the perspective of FIG. 7. The via structures 2126B may be arranged to route electrical signals in a direction of a plane that is substantially perpendicular to the surface of the substrate 2102 upon which the device layer 2104 is formed.

In some embodiments, the via structures 2126B may electrically couple trench structures 2128*a* of different interconnect layers 2106-2110 together.

The interconnect layers 2106-2110 may include a dielectric material 2126 disposed between the interconnect structures 2128, as shown in FIG. 7. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 252.

A first interconnect layer 2106 (referred to as Metal 1 or "M1") may be formed directly on the device layer 2104. In some embodiments, the first interconnect layer 2106 may include trench structures 2128*a* and/or via structures 2126B, as shown. The trench structures 2128*a* of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2126B to couple the trench structures 2128*a* of the second interconnect layer 2108 with the trench structures 2128*a* of the first interconnect layer 2106. Although the trench structures 2128*a* and the via structures 21263 are structurally delineated with a line within each interconnect layer (e.g., within the second interconnect layer 2108) for the sake of clarity, the trench structures 2128*a* and the via structures 21263 may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above. Further metal layers may be present in the IC device 2100, as also described above.

Figure 8:
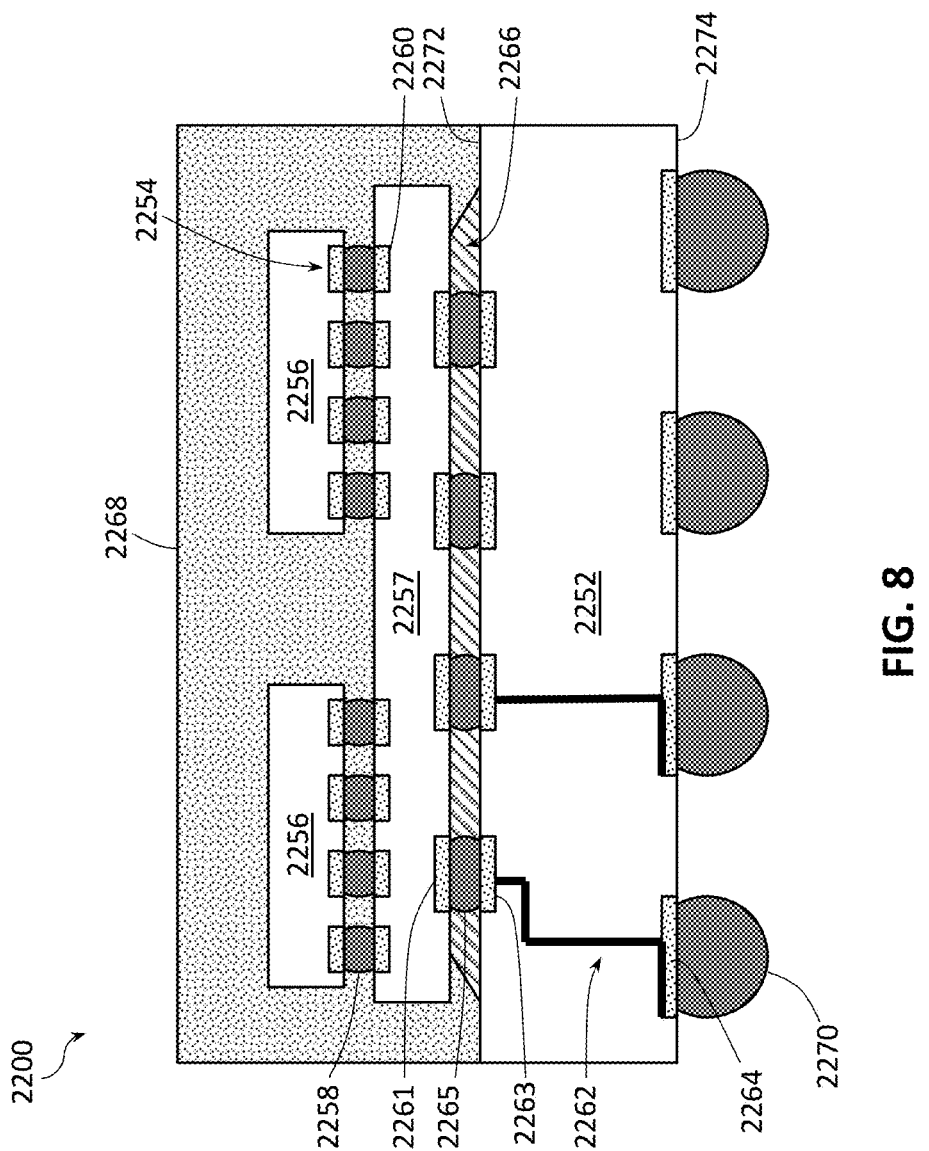
FIG. 8 is a cross-sectional side view of an IC package that may include one or more IC devices with TFT based memory cells on both sides of a layer of logic devices in accordance with any of the embodiments disclosed herein.

FIG. 8 is a side, cross-sectional view of an example IC package 2200 that may include IC devices with TFT based memory cells on both sides of a layer of logic devices in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 7.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include TFT based memory cells on both sides of a layer of logic devices, e.g., as discussed above; in some embodiments, at least some of the dies 2256 may not include TFT based memory cells on both sides of a layer of logic devices.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
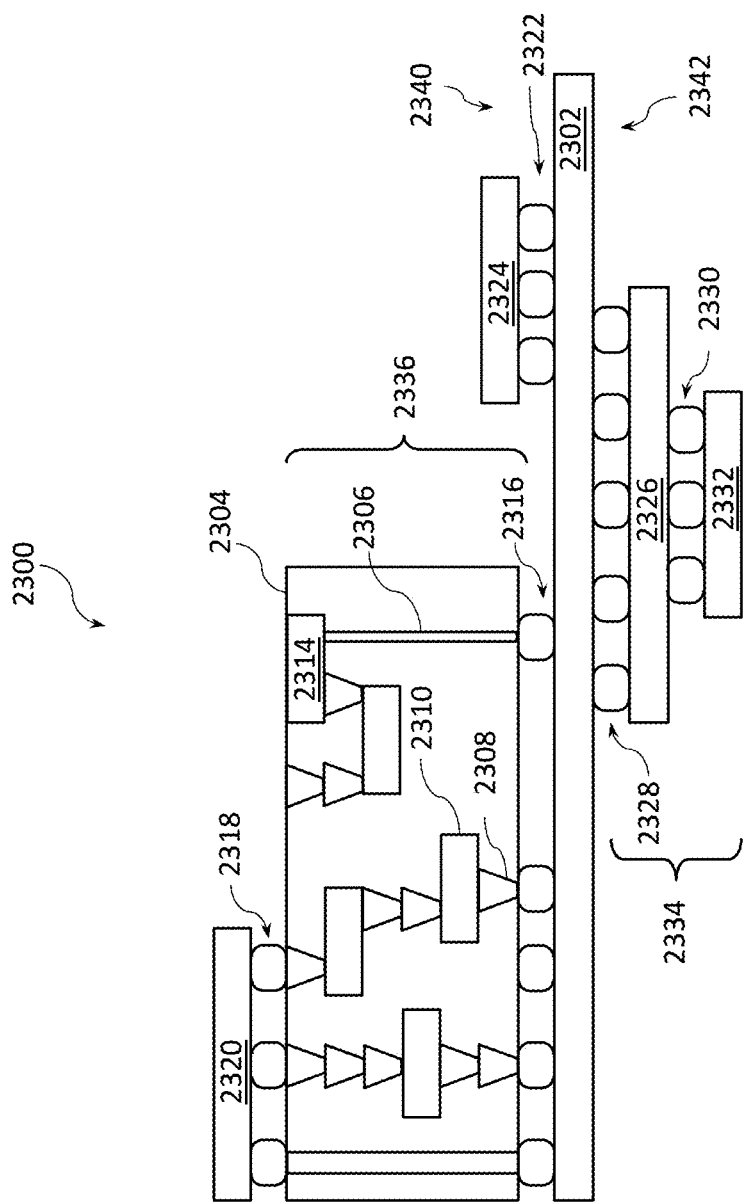
FIG. 9 is a cross-sectional side view of an IC device assembly that may include one or more IC devices with TFT based memory cells on both sides of a layer of logic devices in accordance with any of the embodiments disclosed herein.

FIG. 9 is a cross-sectional side view of an IC device assembly 2300 that may include components having one or more IC devices with TFT based memory cells on both sides of a layer of logic devices in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices with TFT based memory cells on both sides of a layer of logic devices in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include one or more IC devices with TFT based memory cells on both sides of a layer of logic devices provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device 2100 of FIG. 7), or any other suitable component. In particular, the IC package 2320 may include one or more IC devices with TFT based memory cells on both sides of a layer of logic devices as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
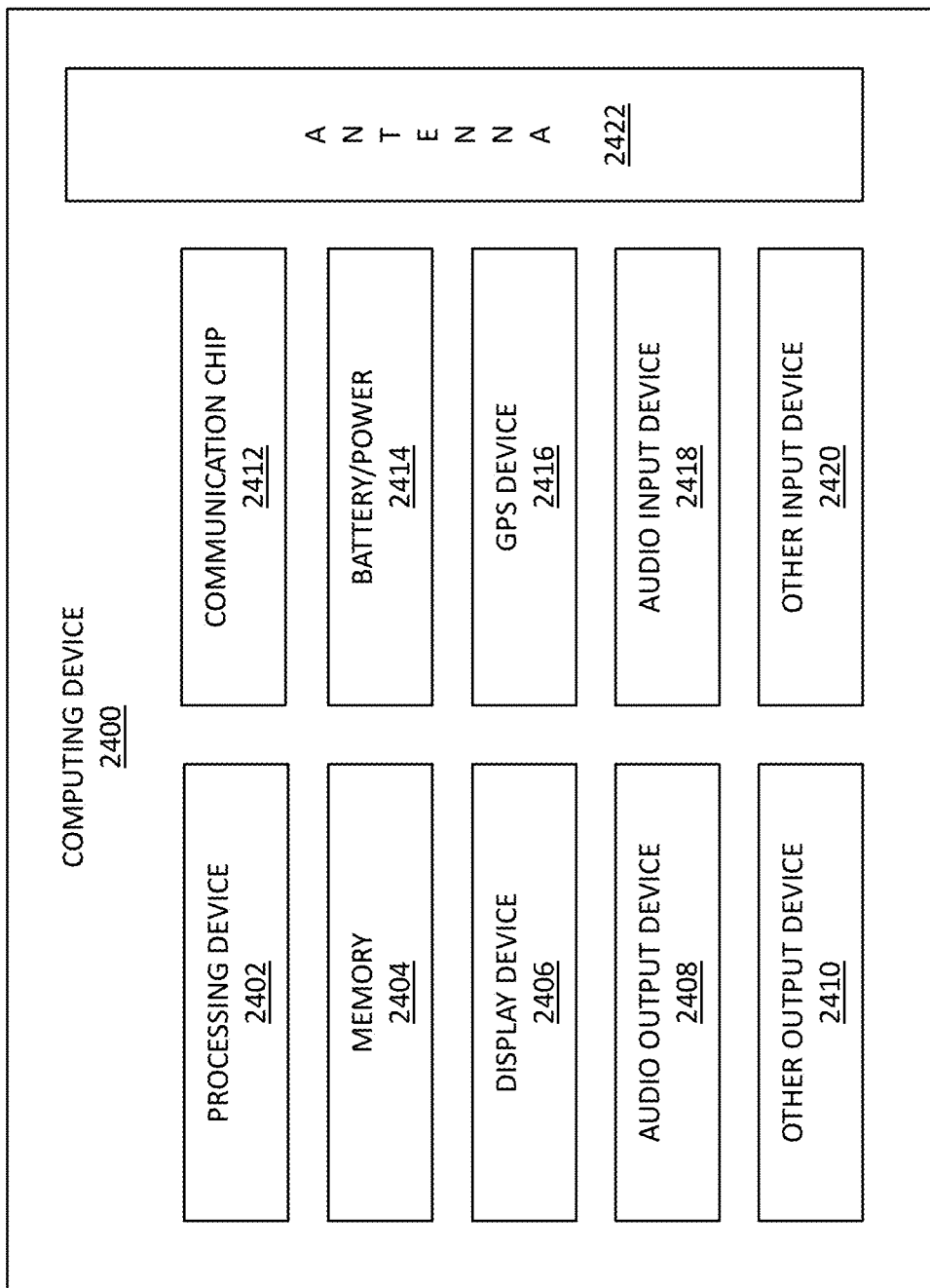
FIG. 10 is a block diagram of an example computing device that may include one or more IC devices with TFT based memory cells on both sides of a layer of logic devices in accordance with any of the embodiments disclosed herein.

FIG. 10 is a block diagram of an example computing device 2400 that may include one or more components with one or more IC devices with TFT based memory cells on both sides of a layer of logic devices in accordance with any of the embodiments disclosed herein. For example, any suitable ones of the components of the computing device 2400 may include a die (e.g., the die 2002 (FIG. 6B)) including one or more stacked TFT based eDRAM memory arrays in accordance with any of the embodiments disclosed herein. Any of the components of the computing device 2400 may include an IC device 2100 (FIG. 7) and/or an IC package 2200 (FIG. 8). Any of the components of the computing device 2400 may include an IC device assembly 2300 (FIG. 9).

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include one or more IC devices with TFT based memory cells on both sides of a layer of logic devices as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 602.11 family), IEEE 602.16 standards (e.g., IEEE 602.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 602.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 602.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Select Examples

The following paragraphs provide various examples of the embodiments disclosed herein.

Example 1 provides an IC device that includes a first memory cell in a first layer over a support structure; and a second memory cell in a second layer over the support structure, where the support structure is between the first layer and the second layer, where each of the first memory cell and the second memory cell includes a TFT. The term "support structure" is to be used in a broad sense in the present examples and the claims to cover not only the materials described with respect to the support structure 520 that may be a substrate, a die, or a chip, but also to cover embodiments where at least a portion, or all, of the material of the support structure 520 was removed and the openings created by the removal have been refilled with another material, e.g., with a dielectric material, as described above with reference to the further embodiments of the process 408 and the corresponding modification to the drawings of FIG. 5D-5H. The same applies to all of the subsequent examples and claims.

Example 2 provides the IC device according to example 1, further including logic devices in a third layer over the support structure, where the third layer is between the first layer and the support structure.

Example 3 provides the IC device according to examples 1 or 2, further including a via (i.e., an opening that is at least partially filled with at least one electrically conductive material, to provide electrical connectivity) extending between a first face of the support structure and a second face of the support structure, the second face being opposite the first face.

Example 4 provides the IC device according to example 3, where the via has a first end at the first face of the support structure and a second end at the second face of the support structure, the first face of the support structure is closer to the first layer than to the second layer, the second face of the support structure is closer to the second layer than to the first layer, the first end of the via is coupled to the first memory cell, and the second end of the via is coupled to the second memory cell.

Example 5 provides the IC device according to any one of the preceding examples, further including power and/or signal interconnects in a fourth layer over the support structure, where the second layer is between the support structure and the fourth layer.

Example 6 provides the IC device according to any one of the preceding examples, further including first level interconnects (e.g., solder bumps, solder posts, or bond wires), where the second layer is between the support structure and the first level interconnects.

Example 7 provides the IC device according to any one of the preceding examples, further including a carrier substrate, where the first layer is between the support structure and the carrier substrate.

Example 8 provides the IC device according to example 7, further including a bonding layer between the carrier substrate and the first layer.

Example 9 provides the IC device according to any one of the preceding examples, where the TFT includes a channel material, a gate electrode, a first S/D electrode, and a second S/D electrode, where the channel material is between the gate electrode and at least one of the first and second S/D electrodes (e.g., the layer that contains the channel material of the TFT is between a layer that contains the gate electrode of the TFT and a layer that includes at least one of the first and second S/D electrodes of the TFT).

Example 10 provides the IC device according to example 9, where the channel material of the TFT includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

Example 11 provides the IC device according to examples 9 or 10, further including, for each of the first memory cell and the second memory cell, a word-line coupled to the gate electrode, a capacitor coupled to the first S/D electrode, and a bit-line coupled to the second S/D electrode.

Example 12 provides the IC device according to example 11, where, for each of the first memory cell and the second memory cell, the word-line is between the support structure and the gate electrode.

Example 13 provides the IC device according to example 11, where, for each of the first memory cell and the second memory cell, the bit-line is further away from the support structure than the channel material.

Example 14 provides the IC device according to example 11, where each of the first memory cell and the second memory cell further includes a storage node, where the capacitor is coupled to the first S/D electrode by having a bottom electrode of the capacitor being coupled to the storage node and the storage node being coupled to the first S/D electrode, and the capacitor further includes a top electrode coupled to a capacitor plate, and an insulator between the bottom electrode and the top electrode.

Example 15 provides the IC device according to any one of the preceding examples, where each of the first memory cell and the second memory cell is one of a dynamic random-access memory (DRAM) cell, a spin-transfer torque random access memory (STTRAM) cell, or a resistive random-access memory (RRAM) cell. In some examples, each of the first memory cell and the second memory cell may be any non-volatile memory cell.

Example 16 provides a computing device that includes a circuit board and an IC device coupled to the circuit board. The IC device includes a support structure having a first face and an opposite second face, a plurality of first memory cells provided in a layer over the first face of the support structure, and a plurality of second memory cells provided in a layer over the second face of the support structure.

Example 17 provides the computing device according to example 16, where the computing device is one of a wearable computing device (e.g., a smart watch), a handheld computing device (e.g., a mobile phone), or a server processor.

In a further example, the IC device of the computing device according to any one of the preceding examples (e.g., according to examples 16 or 17) may further include one or more communication chips and an antenna.

In various further examples, the IC device of the computing device according to any one of the preceding examples (e.g., according to examples 16 or 17) may be the IC device according to any one of the preceding examples (e.g., the IC device according to any one of examples 1-15).

Example 18 provides a method of fabricating an IC device, the method including forming a via extending from a first face of a support structure (e.g., a substrate) towards, but not reaching, a second face of the support structure (i.e., the via is a blind via at this point), the second face being opposite the second face; forming a logic device proximate to the first face of the support structure (e.g., using a FEOL process for forming conventional logic devices); forming a first memory cell in a layer over the logic device (i.e., in a layer over the first face of the support structure); bonding the first layer to a carrier substrate; thinning the support structure until the via is exposed at the second face of the support structure; and forming a second memory cell in a layer over the second face of the support structure.

Example 19 provides the method according to example 18, where each of the first memory cell and the second memory cell includes a TFT.

Example 20 provides the method according to examples 18 or 19, further including forming one or more first level interconnects over the layer of the second memory cell.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first memory cell in a first layer attached to a support structure;

a second memory cell in a second layer attached to the support structure, wherein the support structure is between the first layer and the second layer; and logic devices in a third layer attached to the support structure, wherein the third layer is between the first layer and the support structure, and wherein each of the first memory cell and the second memory cell includes a thin-film transistor (TFT).

2. The IC device according to claim 1, further comprising first-level interconnects, wherein the second layer is between the support structure and the first-level interconnects.

3. The IC device according to claim 1, further comprising:
a carrier substrate, wherein the first layer is between the support structure and the carrier substrate, and
a bonding layer between the carrier substrate and the first layer.

4. The IC device according to claim 1, wherein the TFT includes a channel material, a gate electrode, a first source/drain (S/D) electrode, and a second S/D electrode, wherein the channel material is between the gate electrode and at least one of the first and second S/D electrodes.

5. The IC device according to claim 4, wherein the channel material includes one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, and black phosphorus.

6. The IC device according to claim 4, further including, for each of the first memory cell and the second memory cell,
a word-line coupled to the gate electrode,
a capacitor coupled to the first S/D electrode, and
a bit-line coupled to the second S/D electrode.

7. The IC device according to claim 6, wherein, for each of the first memory cell and the second memory cell, the word-line is between the support structure and the gate electrode.

8. The IC device according to claim 6, wherein, for each of the first memory cell and the second memory cell, the bit-line is further away from the support structure than the channel material.

9. The IC device according to claim 6, wherein each of the first memory cell and the second memory cell further includes a storage node, wherein:
the capacitor is coupled to the first S/D electrode by having a bottom electrode of the capacitor being coupled to the storage node and the storage node being coupled to the first S/D electrode, and
the capacitor further includes a top electrode coupled to a capacitor plate, and an insulator between the bottom electrode and the top electrode.

10. The IC device according to claim 1, wherein each of the first memory cell and the second memory cell is one of a dynamic random-access memory (DRAM) cell, a spin-transfer torque random access memory (STTRAM) cell, or a resistive random-access memory (RRAM) cell.

11. The IC device according to claim 1, wherein the IC device is a computing device that includes a circuit board and an IC structure coupled to the circuit board, and wherein the IC structure includes the support structure, the first memory cell, the second memory cell, and the logic device.

12. The IC device according to claim 11, wherein the computing device is one of:

a wearable computing device,
a handheld computing device, or
a server processor.

13. The IC device according to claim 1, further comprising a via extending between a first face of the support structure and a second face of the support structure, the second face being opposite the first face.

14. The IC device according to claim 13, wherein:
the via has a first end at the first face of the support structure and a second end at the second face of the support structure,
the first end of the via is coupled to the first memory cell, and
the second end of the via is coupled to the second memory cell.

15. The IC device according to claim 1, further comprising power and/or signal interconnects in a fourth layer over the support structure, wherein the second layer is between the support structure and the fourth layer.

16. A method of fabricating an integrated circuit (IC) device, the method comprising:
forming logic devices in a first layer over a first face of a support structure;
forming a first memory cell in a second layer over the first face of the support structure, so that the first layer is between the first face of the support structure and the second layer; and
forming a second memory cell in a third layer over a second face of the support structure, so that the support structure is between the third layer and the first layer.

17. The method according to claim 16, wherein each of the first memory cell and the second memory cell includes a thin-film transistor (TFT).

18. The method according to claim 16, further including forming one or more first-level interconnects so that the third layer is between the support structure and the first-level interconnects.

19. An integrated circuit (IC) device, comprising:
a first memory cell in a first layer attached to a support structure; and
a second memory cell in a second layer attached to the support structure, wherein the support structure is between the first layer and the second layer;
wherein:
the first memory cell includes a thin-film transistor (TFT), and
a word-line is coupled to a gate electrode of the TFT, a capacitor is coupled to a first one of a source electrode and a drain electrode of the TFT, and a bit-line is coupled to a second one of the source electrode and the drain electrode of the TFT.

20. The IC device according to claim 19, wherein:
the second memory cell includes a further transistor,
a further word-line is coupled to a gate electrode of the further transistor, a further capacitor is coupled to a first one of a source electrode and a drain electrode of the further transistor, and a further bit-line is coupled to a second one of the source electrode and the drain electrode of the further transistor.

21. The IC device according to claim 20, wherein the TFT is a first TFT, and the further transistor is a second TFT.

22. The IC device according to claim 19, wherein the IC device is a computing device that includes a circuit board and an IC structure coupled to the circuit board, and wherein the IC structure includes the support structure, the first memory cell, the second memory cell, the word-line, the capacitor, and the bit-line.

23. The IC device according to claim 22, wherein the computing device is one of:
  a wearable computing device,
  a handheld computing device, or
  a server processor.

* * * * *